United States Patent
Ciolfi et al.

(10) Patent No.: US 9,389,836 B1
(45) Date of Patent: *Jul. 12, 2016

(54) SYSTEM AND METHOD FOR PERFORMING ITERATION IN A GRAPHICAL MODELING ENVIRONMENT

(71) Applicant: THE MATHWORKS, INC., Natick, MA (US)

(72) Inventors: John E Ciolfi, Wellesley, MA (US); Ramamurthy Mani, Wayland, MA (US); Kai Tuschner, Leinfelden-Echterdingen (DE)

(73) Assignee: The MathWorks, Inc., Natick, MA (US)

( * ) Notice: Subject to any disclaimer, the term of this patent is extended or adjusted under 35 U.S.C. 154(b) by 109 days.

This patent is subject to a terminal disclaimer.

(21) Appl. No.: 13/970,021

(22) Filed: Aug. 19, 2013

Related U.S. Application Data

(63) Continuation of application No. 12/251,936, filed on Oct. 15, 2008, now Pat. No. 8,515,723.

(60) Provisional application No. 60/980,406, filed on Oct. 16, 2007.

(51) Int. Cl.
*G06F 17/50* (2006.01)
*G06F 9/45* (2006.01)
*G06F 3/048* (2013.01)
*G06F 9/44* (2006.01)

(52) U.S. Cl.
CPC .................................... *G06F 8/35* (2013.01)

(58) Field of Classification Search
None
See application file for complete search history.

(56) References Cited

U.S. PATENT DOCUMENTS

| | | | |
|---|---|---|---|
| 5,946,211 A | 8/1999 | Glover | |
| 6,654,712 B1 | 11/2003 | Blair | |
| 8,515,723 B1 | 8/2013 | Ciolfi et al. | |
| 2005/0060129 A1 | 3/2005 | Mosterman et al. | |
| 2005/0216248 A1 | 9/2005 | Ciolfi et al. | |
| 2005/0278162 A1 | 12/2005 | Ciolfi et al. | |
| 2006/0129371 A1 | 6/2006 | Orofino et al. | |
| 2006/0282252 A1 | 12/2006 | Ciolfi | |

OTHER PUBLICATIONS

"LabVIEW for Data Acquisition". Mihura, Bruce. © 2001 Prentice Hall. 3 pages.*

* cited by examiner

*Primary Examiner* — Omar Fernandez Rivas
*Assistant Examiner* — Nithya J Moll
(74) *Attorney, Agent, or Firm* — Harrity & Harrity, LLP

(57) ABSTRACT

In an embodiment, in a graphical modeling environment, users may create models that can be executed. Within the graphical modeling environment, users may use implicit iterator systems to manage multiple iterations of systems whereby the indexing of input and output signals may be defined by a user and state may be managed for an iteration. The number of iterations taken by the implicit iterator system can adapt to input and output signal dimensions.

20 Claims, 35 Drawing Sheets

SYSTEM AND METHOD FOR PERFORMING ITERATION IN A GRAPHICAL MODELING ENVIRONMENT

RELATED APPLICATIONS

This application is a continuation of U.S. patent application Ser. No. 12/251,936, filed Oct. 15, 2008, now U.S. Pat. No. 8,515,723, which claims priority under 35 U.S.C. 119(e) to U.S. Provisional Application Ser. No. 60/980,406, filed Oct. 16, 2007, the disclosures of which are incorporated by reference herein.

BACKGROUND

Various classes of block diagrams may describe computations that can be performed on application specific computational hardware, such as a computer, microcontroller, Field Programmable Gate Array (FPGA), and custom hardware. Classes of such block diagrams may include time-based block diagrams, such as those implemented within the well-known Simulink® software product available commercially from The MathWorks, Inc., Natick, Mass., state-based and flow diagrams, such as those found within the Stateflow® software product available from The MathWorks, Inc. and data-flow diagrams. A common characteristic among these various forms of block diagrams is that they may be used to define semantics on how to execute the diagram.

Historically, engineers and scientists have utilized time-based block diagram models in numerous scientific areas, such as feedback control theory and signal processing to study, design, debug, and refine dynamic systems. Dynamic systems, which may be systems where behaviors change over time, may be representative of many real-world systems. Time-based block diagram modeling has become particularly popular with the advent of software products such as the Simulink® software product. Such products may provide sophisticated software platforms with a rich suite of support tools that may make the analysis and design of dynamic systems efficient, methodical, and cost-effective.

Graphical modeling environments, such as those provided by the Simulink® software product may assist in simplifying the process of designing, simulating, and implementing dynamic systems. Tools provided in such software environments may generally permit, e.g., a user to create a graphical representation of a system, such as block diagram representations, statistical diagrams, timing diagrams, and other similar graphical elements that can be used to describe system behavior.

Block diagrams generally include graphical entities having an "executable meaning" that are created within time-based block diagrams for modeling a dynamic system, and generally comprise one or more graphical objects. For example, a block diagram model of a dynamic system may be represented schematically as a first collection of elements including one or more graphical objects, such as nodes, which may be interconnected by another set of graphical objects, generally illustrated as lines, which may represent logical connections between the first collection of graphical objects. In most block diagramming paradigms, the nodes are often referred to as blocks and drawn using some form of geometric object (e.g., circle, rectangle, etc.). The nodes themselves may be blocks that correspond to other subsystems having their own block diagrams.

Line segments connecting graphical objects (or provided as inputs or outputs of graphical objects) are often referred to as signals. Signals may correspond to time-varying quantities represented by one or more line connections and may be assumed to have values at each time instant. A node may represent an elemental dynamic system, and relationships between signals and state variables may be defined by sets of equations represented by the nodes. Inherent in the definition of signals is the notion of parameters, which may be coefficients of equations. Such equations may generally define a relationship between input signals, output signals, state, and time, so that one or more lines may represent the input and/or output of an associated elemental dynamic system. A line emanating at one node and terminating at another may signify that the output of the first node is provided as an input to the second node. A distinct input or output on a node may be generally referred to as a port. A source node of a signal may generate the signal and write the signal to an output port at a given time instant when its system equations are solved. A destination node that receives this signal may read this signal when their system equations are being solved. Here, the term "nodes" may not refer exclusively to elemental dynamic systems but may also include other modeling elements that aid in readability and modularity of block diagrams.

For example, in the Simulink® software product, an example of a time-based block diagram environment may include a model of a dynamic system defined as a block diagram comprising a number of graphical objects. As discussed, a block diagram may comprise a plurality of nodes, called blocks, which may be interconnected by lines that represent signals. A block may represent a functional entity, such as an elementary dynamic system, which may implement a mathematical operation, e.g., an algorithm or equation, on the data being processed by the system represented by the block diagram. A block may produce an output either continuously (a continuous block) or at specific points in time (a discrete block). The type of the block often determines a relationship between a block's outputs and its inputs, states, and time. A block diagram can contain any number of instances of any type of block needed to model a system. The signals in a block diagram model may represent a time-varying quantity that may be updated, e.g., read-by and written-to, by the blocks. Software products used to model dynamic systems may provide a graphical user interface (GUI) for building models of dynamic systems as block diagrams. A block diagram may be built by dragging and dropping blocks provided in pre-defined blocksets or custom developed by, e.g., a user.

Other examples of block diagrams may include state chart diagrams, such as those found within the well-known Stateflow® software product, also available from The MathWorks, Inc., data flow diagrams, and so on. Many graphical modeling systems employing block diagrams are hierarchical. A hierarchical diagram often consists of 'layers' where a layer may be a diagram in and of itself and may be represented in a 'parent' layer as a single block. Connections to the block may be routed into a lower layer. This lower layer may also include blocks, along with other blocks that refer to other block diagrams which may be lower in the hierarchy.

SUMMARY

According to one aspect, a computer-implemented method is provided that comprises displaying a model representing a modeled system, the model having at least one object processing at least one element in the model, the at least one object configured to perform a plurality of iterations, performing the plurality of iterations based on a dimension of the at least one element in the model, and for an iteration in the plurality of iterations, storing one or more states of the at least one object, the one or more states being associated with the iteration. According to one embodiment of the present invention, the element includes at least one of an input signal, an output signal, a parameter, or a state value. According to another embodiment, the object includes at least one of a subsystem of a block diagram model, or a referenced model of a block diagram model, or a block of a block diagram model, or a state of a state diagram model, or a hierarchical node in a data flow model.

According to another embodiment, the method further comprises determining a number of plurality of iterations from signal dimension propagation. According to another embodiment, the method further comprises indexing at least one signal of the at least one object. According to another embodiment, the method further comprises indexing a state of the at least one object. According to another embodiment, the method further comprises providing operators that examine the plurality of iterations. According to another embodiment, the method further comprises indexing a parameter of the at least one object.

According to one embodiment of the present invention, the method further comprises displaying an indication identifying that the at least one object is capable of performing iterations based on the dimension of the at least one element. According to another embodiment, the method further comprises displaying an indication of a current iteration in a debugging mode of the model. According to another embodiment, the method further comprises storing overlapped states among at least two of the plurality of iterations. According to another embodiment, one or more states stored for at least one other object do not change among the plurality of iterations.

According to another embodiment, the method further comprises indexing at least one other port of the object, the indexing of the at least one other port of the element being different than the indexing of the at least one port of the object. According to another embodiment, the method further comprises varying the plurality of iterations in response to a change in dimension of the at least one element. According to another embodiment, the method further comprises displaying an option to select an active state in response to the change in dimension of the at least one element. According to another embodiment, the method further comprises displaying an option to reset at least one state of the at least one object before at least one of the plurality of iterations.

According to one aspect of the present invention, an apparatus comprises means for creating at least one object in a model, the at least one object configured to process at least one element in the model, the at least one object configured to perform a plurality of iterations, means for performing the plurality of iterations based on a dimension of the at least one element in the model, and means for storing, for an iteration in the plurality of iterations, a set of states of the at least one object, wherein the one or more states are associated with the iteration. According to one embodiment of the present invention, the element includes at least one of an input signal, an output signal, a parameter, or a state value.

According to another embodiment, the apparatus further comprises means for determining a number of plurality of iterations from signal dimension propagation. According to another embodiment, the apparatus further comprises means for indexing at least one signal of the object. According to another embodiment, the apparatus further comprises means for indexing at least one state of the at least one object. According to another embodiment, the apparatus further comprises means for providing operators that examine the plurality of iterations. According to another embodiment, the apparatus further comprises means for indexing at least one parameter of the at least one object.

According to one aspect of the present invention, a computer system comprises a storage element configured to store a graphical program representation, the representation including at least one object configured to process at least one element of the graphical program representation, a simulation engine adapted to execute the graphical program representation, and configured to perform a plurality of iterations with the at least one object, a number of iterations performed based on a dimension of the at least one element, wherein the storage element is configured to store a set of states associated with an iteration in the plurality of iterations, an interface configured to display an output of the execution of the graphical program representation. According to one embodiment of the present invention, the interface comprises a user control that is adapted to index at least one signal of the at least one object.

According to another embodiment, the interface comprises a user control that is adapted to index at least one state of the at least one object. According to another embodiment, the interface comprises a user control that is adapted to provide operators that examine the plurality of iterations. According to another embodiment, the interface comprises a user control that is adapted to index at least one parameter of the at least one object. According to another embodiment, the simulation engine is adapted to vary the number of the plurality of iterations in response to a change in dimension of the at least one element. According to another embodiment, the interface is adapted to display an indication of a current iteration in a debugging mode of the graphical program representation. According to another embodiment, the interface comprises a control that is adapted to reset at least one state of the at least one element before at least one of the plurality of iterations. According to another embodiment, the computer system further comprises a control that is adapted to select an active state in response to the change in dimension of the at least one element.

According to one aspect of the present invention, a computer system comprises a storage element configured to store a graphical program representation, the representation including at least one state representation of a modeled system, the at least one state representation representing one or more objects of the modeled system and having a dimension, and the at least one state representation including at least one operator that is adapted to determine an outcome of at least one of the plurality of iterations based on a plurality of respective states of the one or more objects of the modeled system, a processor adapted to execute the graphical program representation, the processor being configured to perform a plurality of iterations with the at least one state representation, a number of iterations in the plurality of iterations being performed based on the dimension of the at least one state representation, the processor being responsive to the at least one operator, and an interface configured to display an output of the at least one operator. According to one embodiment of the present invention, the computer system further comprises a storage element configured to hold one or more states associated with at least one of the other one or more objects for one or more iterations. According to another embodiment, the at least one operator is adapted to determine if any of the one or more objects is in a particular state. According to another embodiment, a number of the one or more objects may change. According to another embodiment, the at least one operator is adapted to determine if all of the one or more objects is in a particular state.

According to one aspect of the preset invention, one or more computer-readable media comprising computer-executable instructions is provided. The media comprises one or more instructions for displaying a model representing a modeled system, the graphical model having at least one object processing at least one element in the model, the at least one object being configured to perform a plurality of iterations, performing the plurality of iterations based on a dimension of the at least one element in the model, and storing, for an iteration in the plurality of iterations, a set of states associated with the iteration. According to one embodiment of the present invention, the element includes at least one of an input signal, an output signal, a parameter, or a state value.

According to another embodiment, the object includes at least one of a subsystem of a block diagram model, or a referenced model of a block diagram model, or a block of a block diagram model, or a state of a state diagram model a hierarchical node in a data flow model. According to another embodiment, the computer-readable medium further comprises one or more instructions for determining a number of plurality of iterations from signal dimension propagation. According to another embodiment, the computer-readable medium further comprises instructions for indexing at least one signal of the at least one object. According to another embodiment, the computer-readable medium further comprises instructions for indexing a state of the at least one object. According to another embodiment, the computer-readable medium further comprises instructions for examining the plurality of iterations.

According to one embodiment of the present invention, the computer-readable medium further comprises instructions for indexing a parameter of the at least one object. According to another embodiment, the computer-readable medium further comprise instructions for displaying an indication identifying that the at least one object is capable of performing iterations based on the dimension of the at least one element. According to another embodiment, the computer-readable medium further comprises instructions for displaying an indication of a current iteration in a debugging mode of the model. According to another embodiment, the computer-readable medium further comprises instructions for storing overlapped states among at least two of the plurality of iterations. According to another embodiment, states stored for the at least one object do not change among the plurality of iterations.

According to another embodiment, the computer-readable medium further comprises instructions for displaying an option to specify a parameter set to be used with a particular iteration of the plurality of iterations. According to another embodiment, the at least one object has one or more ports, and wherein the computer-readable medium further comprises instructions for indexing at least one other port of the object, the indexing of the at least one other port of the element being different than the indexing of the at least one port of the object.

According to another embodiment, the computer-readable medium further comprises instructions for varying the plurality of iterations in response to a change in dimension of the at least one element. According to another embodiment, the computer-readable medium further comprises instructions for selecting an active state in response to the change in dimension of the at least one element. According to another embodiment, the computer-readable medium further comprises instructions for displaying an option to reset at least one state of the at least one object before at least one of the plurality of iterations.

Further features and advantages as well as the structure and operation of various embodiments are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The accompanying drawings are not intended to be drawn to scale. In the drawings, each identical or nearly identical component that is shown in various figures is represented by a like numeral. For the purpose of clarity, not every component may be labeled in every drawing. In the drawings.

DETAILED DESCRIPTION

According to one aspect, it is appreciated that graphical programming languages may benefit from elements that are capable of advanced forms of iteration. According to one aspect, a capability may be provided that permits, e.g., a user, to define indexing of ports for a particular block. Further, according to another aspect, a block may be provided that manages states for one or more iterations. According to another aspect, the block may be capable of adapting to a variety of input and output signals having varying dimensions. One or more of such features may be useful for blocks which are designed to perform similar types of processing on a variety and/or selective portions of a signal.

In block-diagram environments, such as the well-known Simulink® product, there is sometimes a need for identical processing to be carried out over different elements (or sub-regions) of a signal. One way of achieving such processing within a block diagram programming environment may include replicating the graphical elements needed to perform processing. As discussed further below, iteration may be performed using various available graphical programming constructs, such as conventional iterator and block processing constructs.

Figure 1:
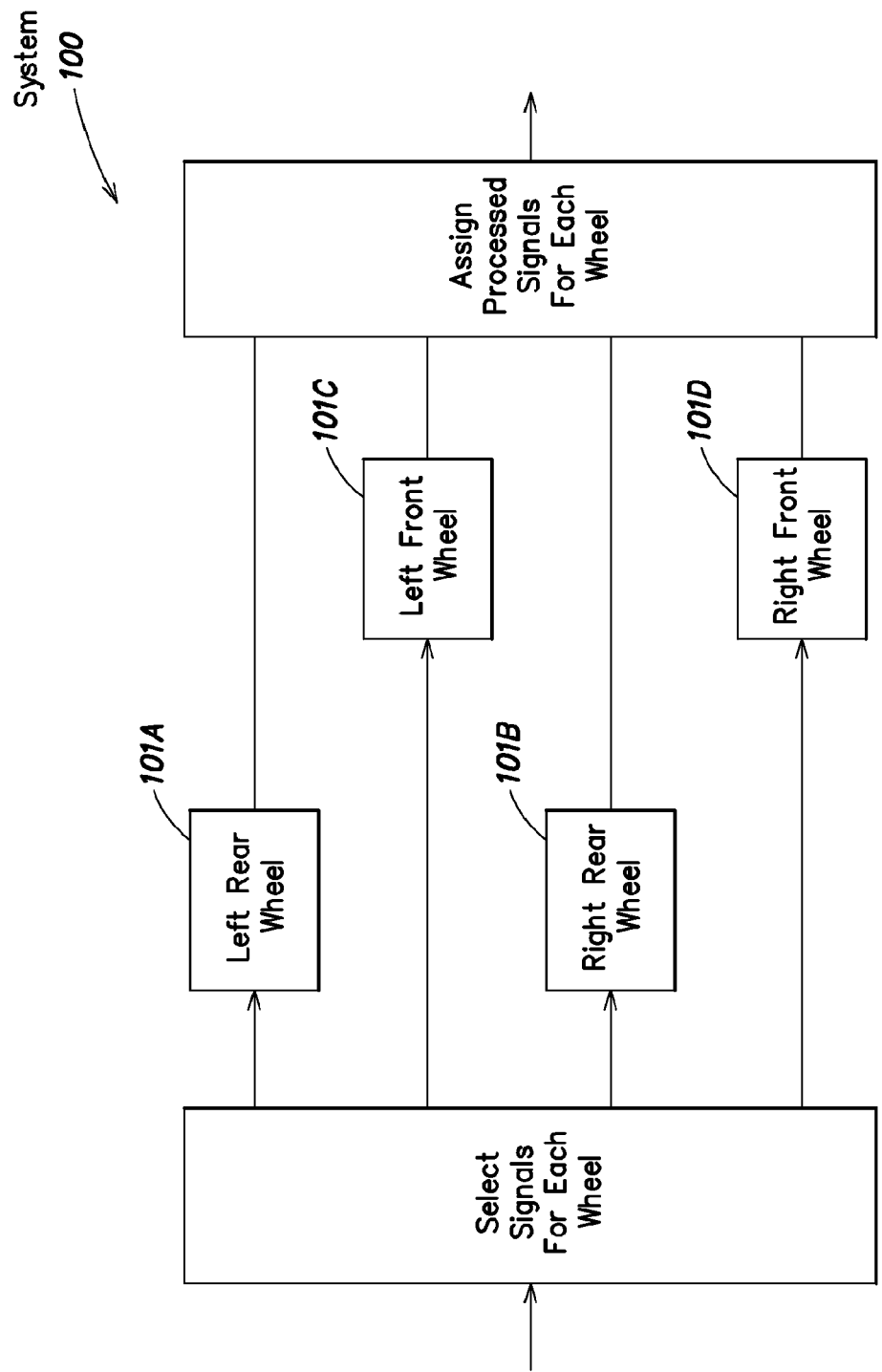
FIG. 1 illustrates an example automotive system that could be modeled using modeling software.

For example, FIG. 1 shows an example of an automotive system 100 that may be modeled in a block diagram environment. System 100 includes models 101A-101D that represent each wheel, along with signal inputs and outputs that are provided to the models. If one were to examine the processing for each wheel model 101A-101D, the same "contents" may be found for each block used to model a wheel. Therefore, it may be advantageous to create one representation of the wheel control model in a "library" block and reference the "library" block four times, one reference for each wheel. This approach, however, may not be optimal as blocks are replicated, (e.g., one copy of a block for each wheel).

Another alternative may include creating a separate wheel model and referencing the model four times using an entity known in the Simulink environment as a Model Block. While either of these approaches may work well, they may be less than ideal. In particular, the readability of the block diagram may be affected by its verboseness, as all of the replicated models are represented and displayed within the interface of the block diagram. Further, it may be difficult and inefficient to connect all of the lines that need to be connected to conceptually the same type of block.

Figure 2A:
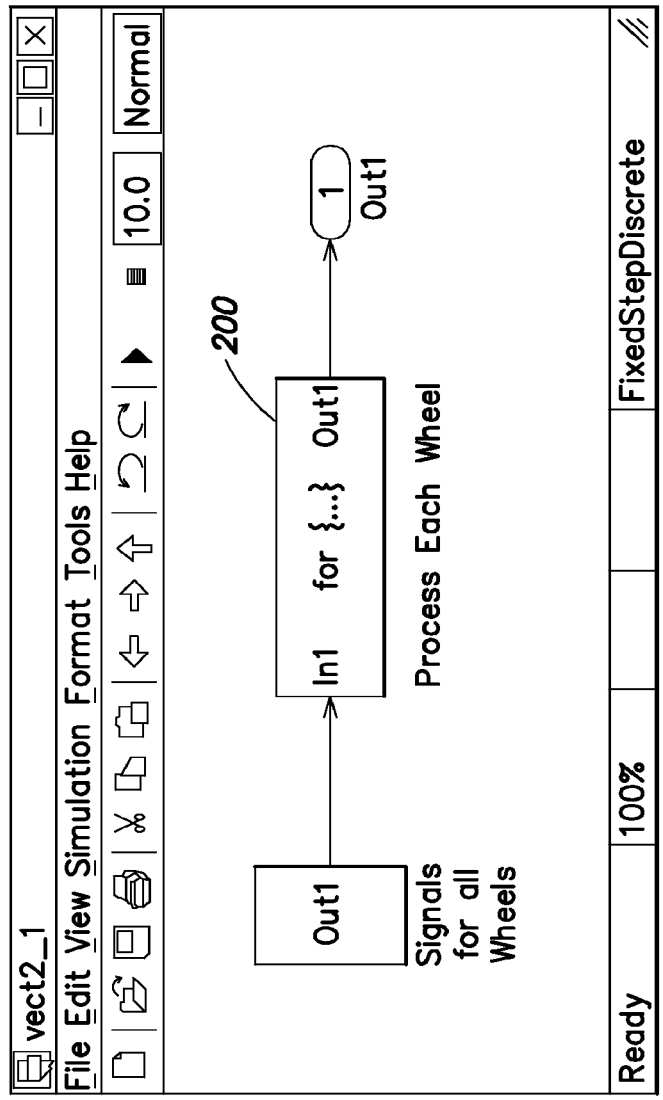
FIGS. 2A-2B illustrates a modeling of an automotive system shown in FIG. 1 using conventional toolsets.
Figure 2B:
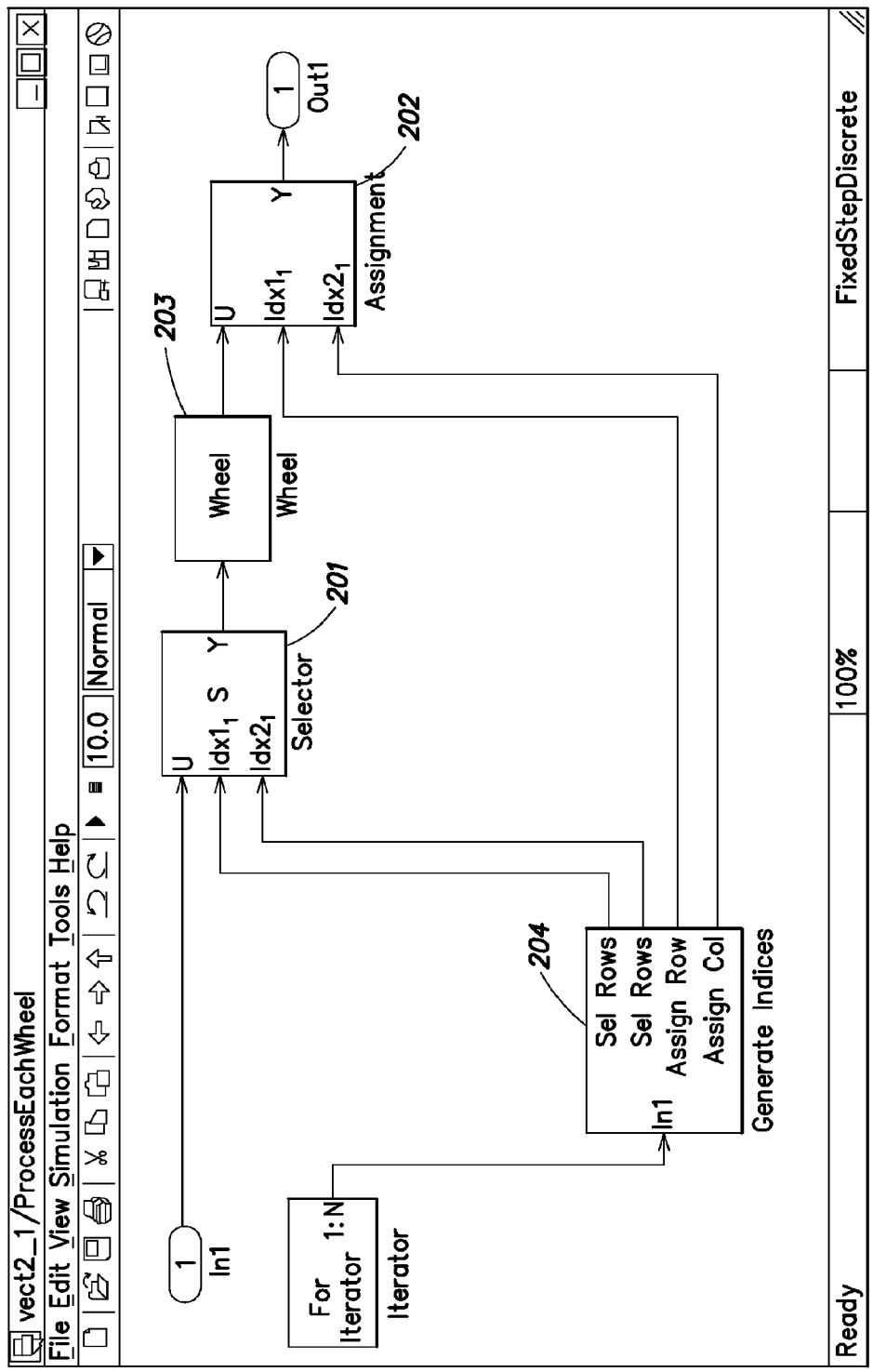

Assuming that the mathematical representation of a wheel does not contain states, processing of the representation may be much easier, and iteration may be handled using models as more fully outlined below. For instance, a "For Iterator Subsystem" (or block), as found in the Simulink® programming environment (or other similar subsystems providing similar functionality in other programming environments), may be provided that can be used to simplify the example automotive system 100. One example simplification of system 100 is shown in FIGS. 2A-2B. More particularly, as shown in FIG. 2A, one block 200 is used to represent the processing performed for each wheel, and connections for the model are simplified as a result. As shown in FIG. 2B, Selector block 201 and Assignment block 202 are used to perform operations on a simplified Wheel model 203 according to indices generated by a Generate Indices block 204.

In FIGS. 2A-2B, a further simplification to an iterator construct may be provided that obviates the need for Selector block 201 and Assignment block 202, among others. This simplification may involve using textual notations to indicate how a signal (1) may be decomposed into individual sub-regions (or signal blocks) and (2) is only responsible for showing the processing that may be performed on one block.

Figure 3:
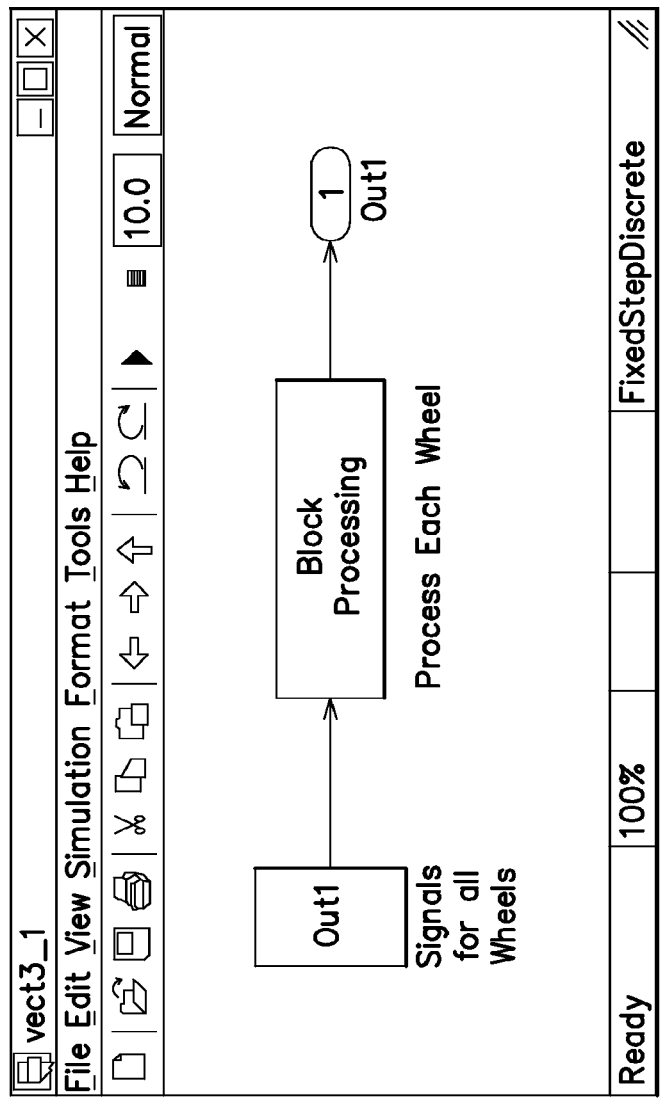
FIG. 3 illustrates another modeling of the system of FIG. 1 using block processing.
Figure 4:
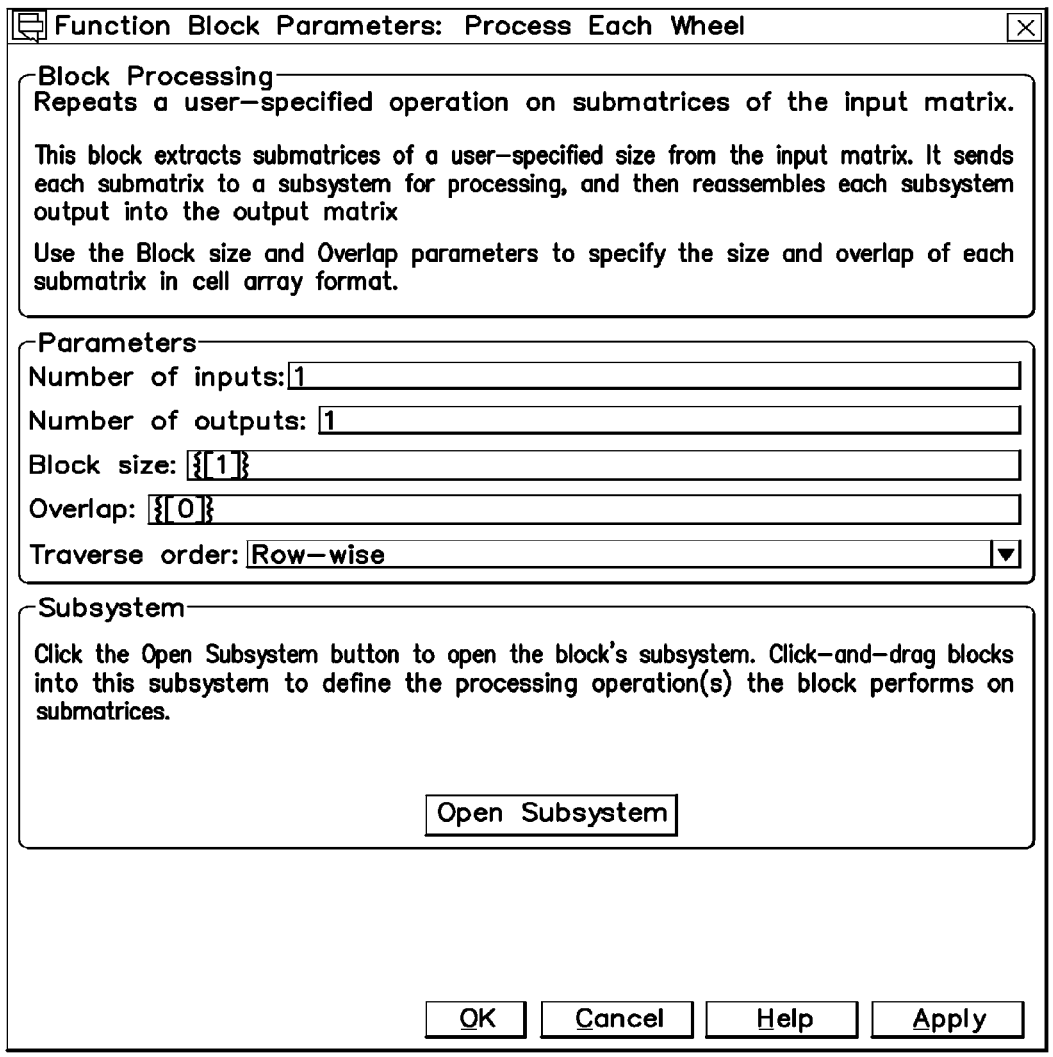
FIGS. 4 and 5 illustrate interfaces associated with the block modeling example of FIG. 3.
Figure 5:
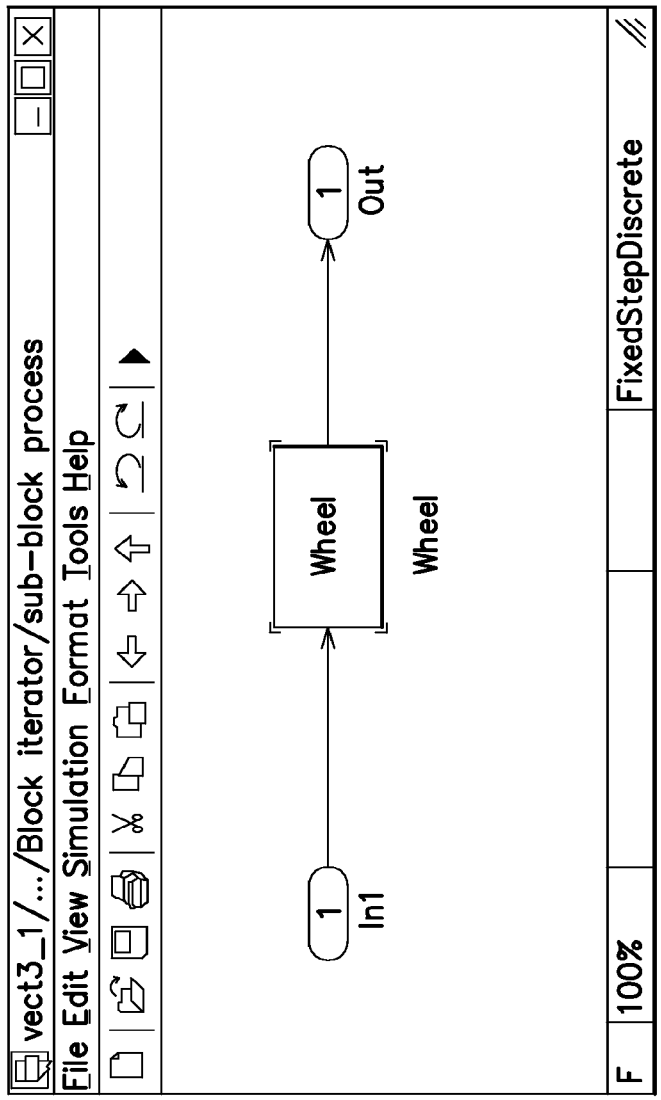

For instance, the example shown in FIG. 3 uses a block-processing subsystem that does not require Selector and Assignment blocks, as discussed above. Rather, parameters may be provided that define how sub-matrices may be extracted from an input matrix (e.g., a signal) and processed. FIGS. 4 and 5 show example interfaces of a configuration of function block parameters and its associated sub-block using the wheel example discussed above. As shown in FIG. 4, a number of inputs and outputs to be processed, a size of the sub-block to be processed, and how the elements should be processed (e.g., order of processing, amount of overlap, etc.) may be specified, e.g., by a user. FIG. 5 shows a Wheel sub-block that may be referenced by the block processing subsystem of FIG. 3.

However, for the automotive example discussed above, it is appreciated that the wheel model may be a dynamic system having states. The above-described "For Iterator Subsystem" may not work properly because the same states may be applied to each wheel resulting in an invalid simulation.

Figure 6A:
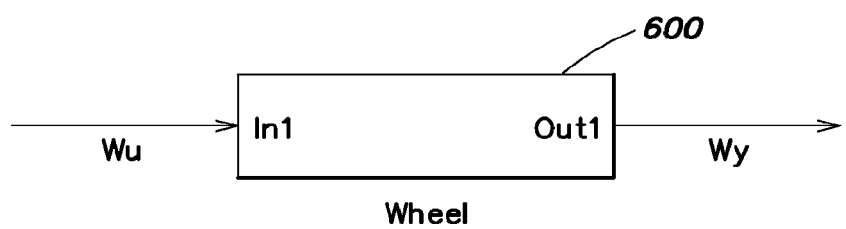
FIGS. 6A-6B illustrate a modeling of the system of FIG. 1 using a state space block.
Figure 6B:
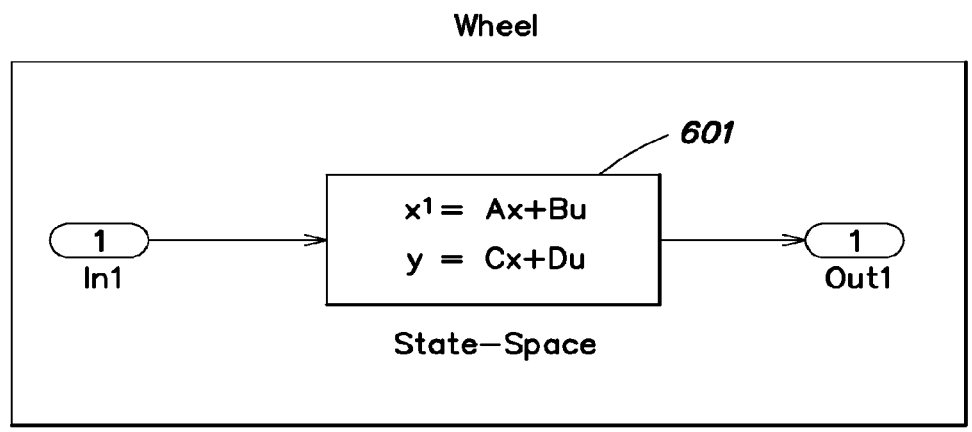

For example, assume the dynamic behavior of a wheel is being modeled as the wheel moves. Assuming the wheel model is a linear system, the system may be represented using a state space block 601 as shown in FIG. 6B. As shown in FIG. 6A, a Wheel model 600 is provided that has input state Wu and output Wy. As shown in FIG. 6B, the wheel model 600 may be represented using the following equations:

$$\dot{X}(t)=A*X(t)+B*u(t)$$

$$y(t)=C*X(t)+D*u(t)$$

Where X(t) is the state for the State-Space block 601, u(t) is the input signal, y(t) is the output signal, and t represents time. If the same state vector X(t) is used in each iteration, then corrupted simulation results may be received because the model may be attempting to save state information for four wheels in one state vector as opposed to properly saving state information in four state vectors. That is, it is appreciated that each wheel has its own forces acting on a respective wheel, and thus each model that represents a wheel should track its own set of states.

Figure 7:
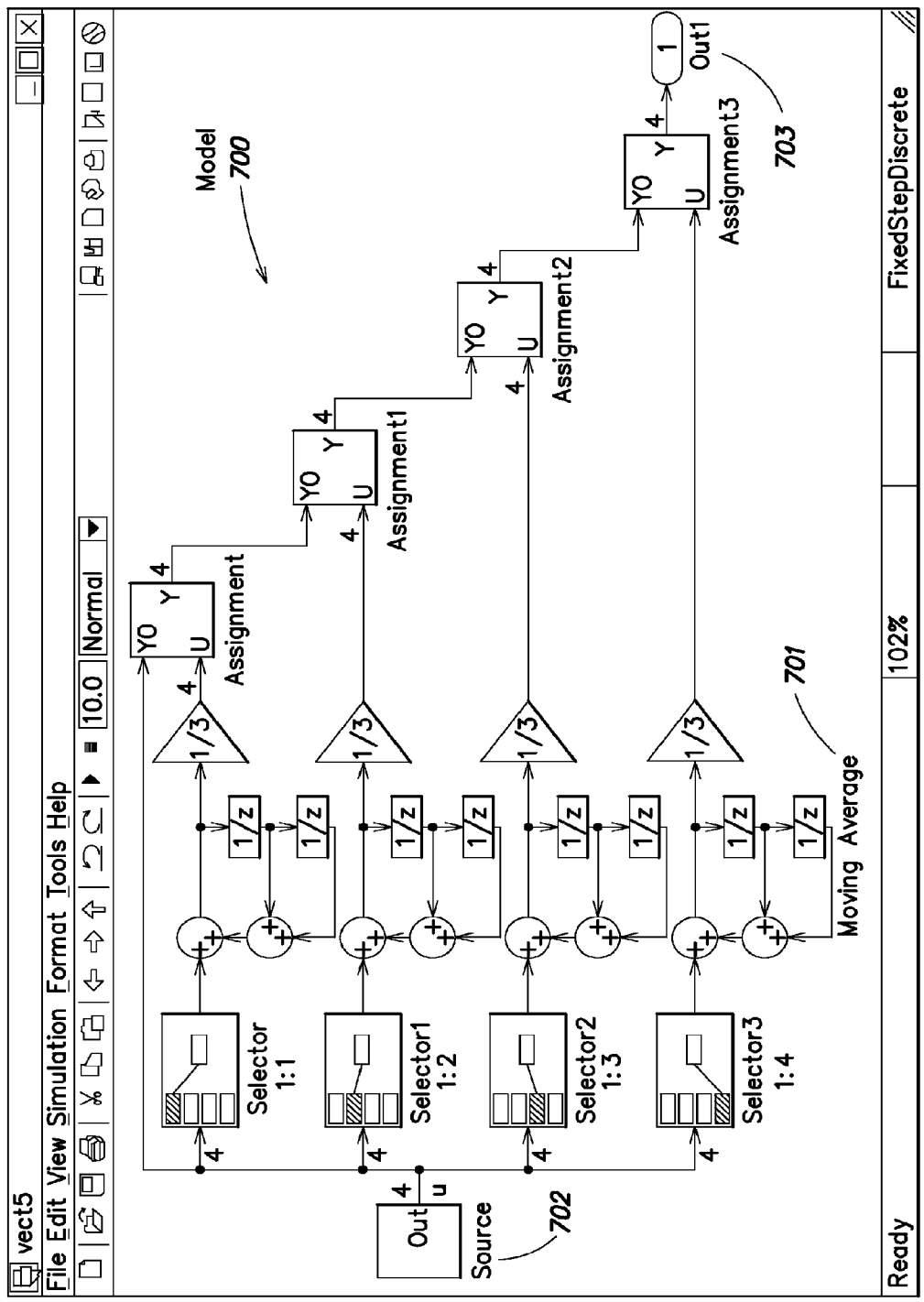
FIG. 7 illustrates an example model of a system that generates a 3-point moving average.

To further understand limitations associated with For Iterator Subsystem and Block-Processing constructs, consider a system model 700 that is implemented as shown in FIG. 7. In the example model 700 shown in FIG. 7, it can be observed that the Moving Average section 701 comprises four separate block patterns representing a 3-point moving average, where each pattern includes two sums, two unit delays, and a gain block. Further, the example in FIG. 7 includes logic that is related to a selection and assignment of Source signal 702 and Out1 signal 703. Model 700 may process an element of the Source signal through a 3-point moving average with the averaging performed over time instead of simply within a sub-region (as defined by the Block Processing block).

Figure 8:
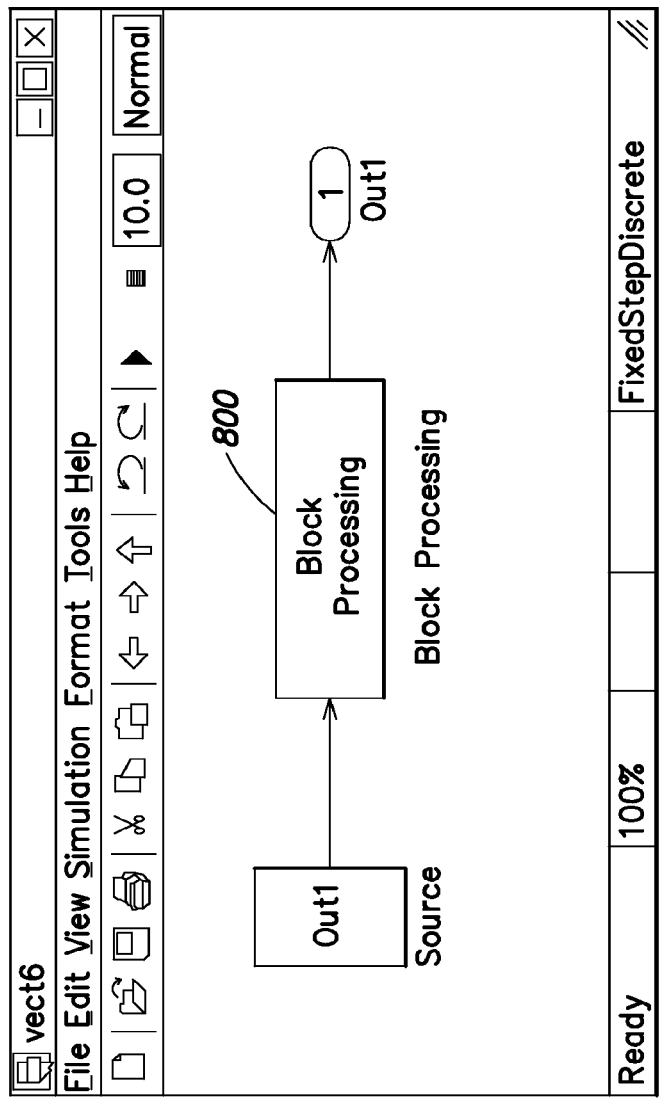
FIGS. 8-10 illustrate example interfaces associated with the block diagram modeling example of FIG. 7.
Figure 9:
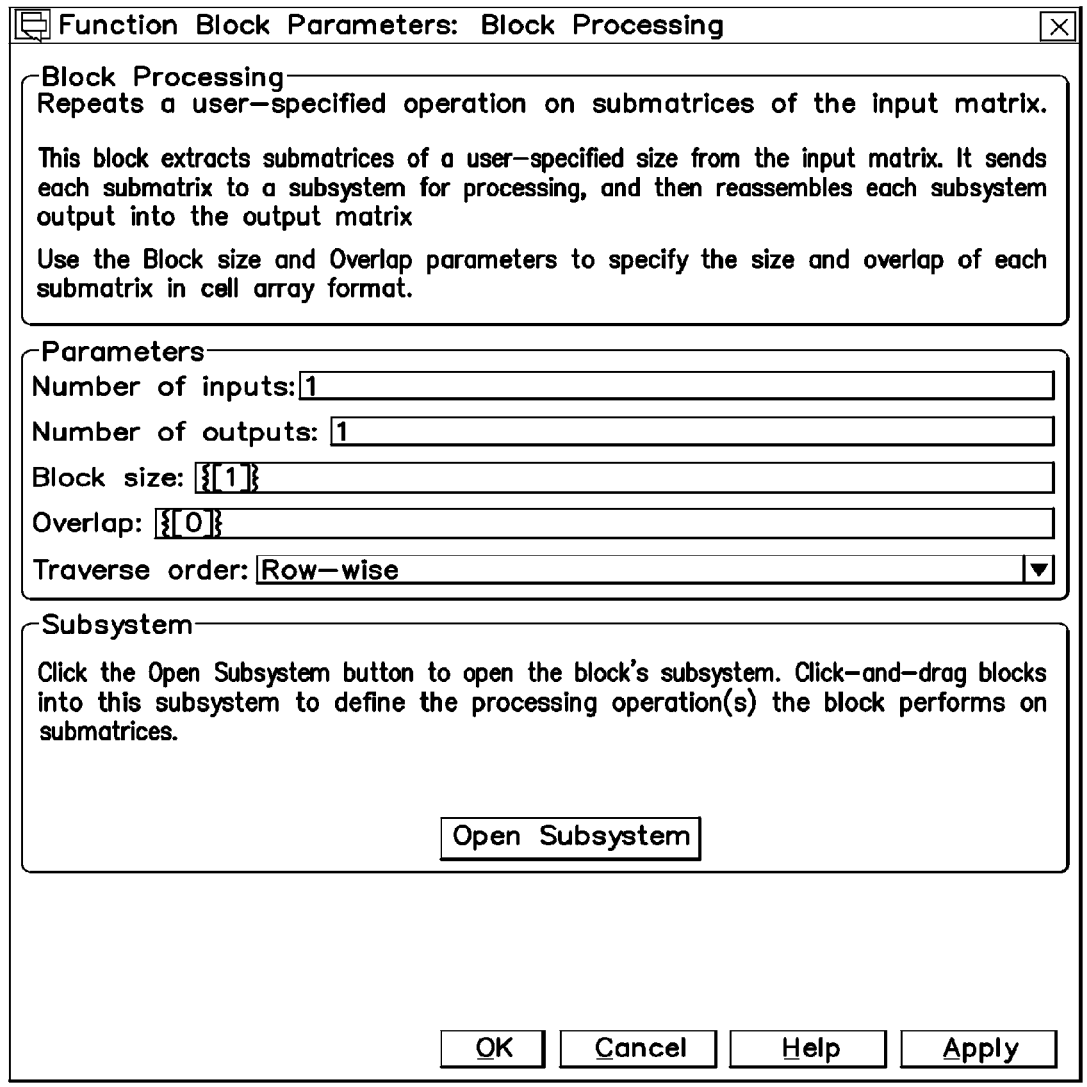

Model 700 may be simplified to graphically show a 3-point moving average that may be applied to an element of Source signal 702. However, using conventional block modeling constructs as discussed above, modeling of such a system may not be possible. More particularly, if these systems were graphically programmed using the Block Processing block, as shown in FIG. 8, the desired behavior may not be achieved. This may be primarily because there may be only one implementation of the moving average within the Block Processing block 800. FIG. 9 shows an interface similar to the function block process configuration interface of FIG. 4, where a number of inputs and outputs to be processed, a size of the sub-block to be processed, and how the elements should be processed (e.g., order of processing, amount of overlap, etc.) may be specified, e.g., by a user.

Figure 10:
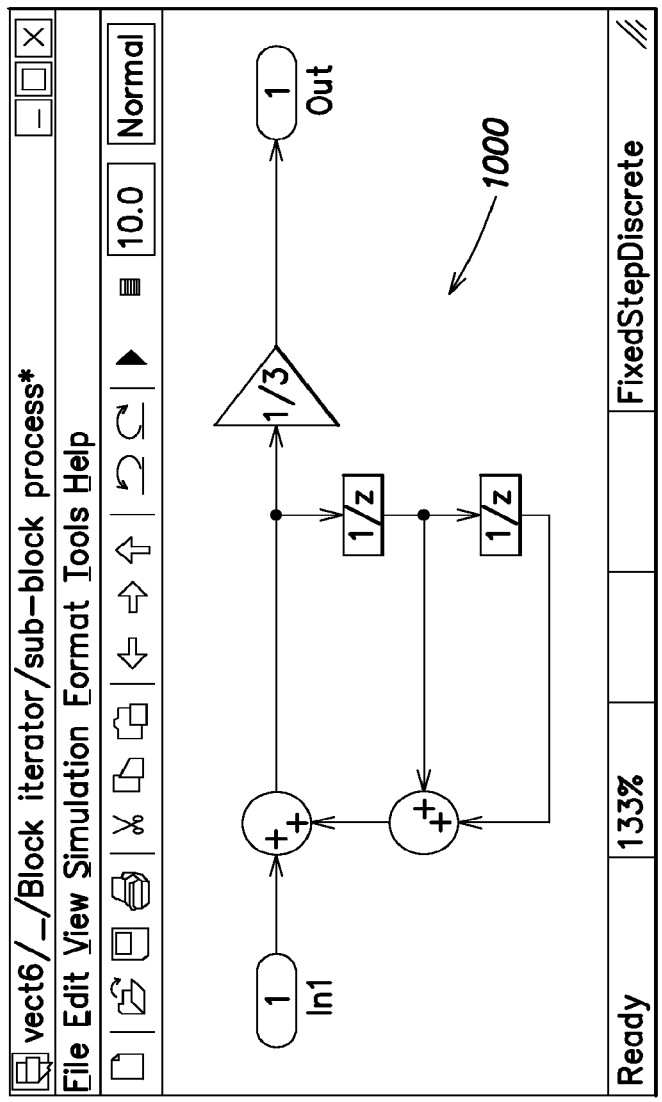

To obtain a correct result, the previous two samples (often referred to as the "states") of each of the four elements of the original signal may be needed. For instance, in the original implementation shown in FIG. 7, that does not use the For Iterator Subsystem or Block Processing subsystem, the states may be held by the eight delay blocks shown in the "Moving Average" section of the diagram. Instead, a "two delay blocks" block, in the Block Processing block 800, may simply maintain the two samples from two previous iterations of the subsystem. This drawback may extend to continuous or discrete-time system with states that may be repeated over various sub-regions of the original signal. Conventional For/While Iterator subsystems may also suffer from the same drawbacks of the Block Processing block. Examples of block programming that have such limitations are shown by way of example in FIGS. 8-10 implementing 3-point moving average function as discussed above. In particular, FIG. 10 shows a signal 3-point moving average section that can selectively be used to process an input signal matrix. As discussed, such a model may have drawbacks as states may need to be stored for all of the various input signals.

Further drawbacks of the Block Processing subsystem 1000 may include the following:
(1) The inability to provide multiple input signals to the subsystem that are indexed differently or not indexed at all during each iteration;
(2) The inability to index into how the output signals are filled up in a manner different from the inputs;
(3) The inability to provide different parameters for the blocks used to process each different iteration of the input signal;
(4) The inability to specify whether or not states are iteration specific or shared across iterations; and
(5) The inability to have a number of iterations be automatically determined from input and/or output signal dimensions.

In some block diagram environments, signals processed by some models may be associated with one or more characteristics (e.g., dimension) that may vary over time. For example, consider the moving average example discussed above with respect to FIG. 10 in the context a signal that has a dimension size that changes over time. Assume that the size of the input signal "u" changes from 4 to 3 at some point during the operation of the system. That is, the input signal "u" changes from having four components of the signal (e.g., as represented in a matrix, a vector, a set of complex variables, etc.) to having only three components.

Note that the four moving average blocks may have states stored in them corresponding to four element signals that may have been processed by the blocks prior to the input signal changing in signal dimension size from 4 to 3. After the input signal changes in size, it may be difficult to determine what models of these filters should now be used to process the 3-element signal. This information may be implicit in the actual application scenario being modeled, and thus need to be provided externally by, e.g., a user. One way to avoid this issue may be to implement a system illustrated in FIGS. 11A, 11B, and 12.

Figure 11A:
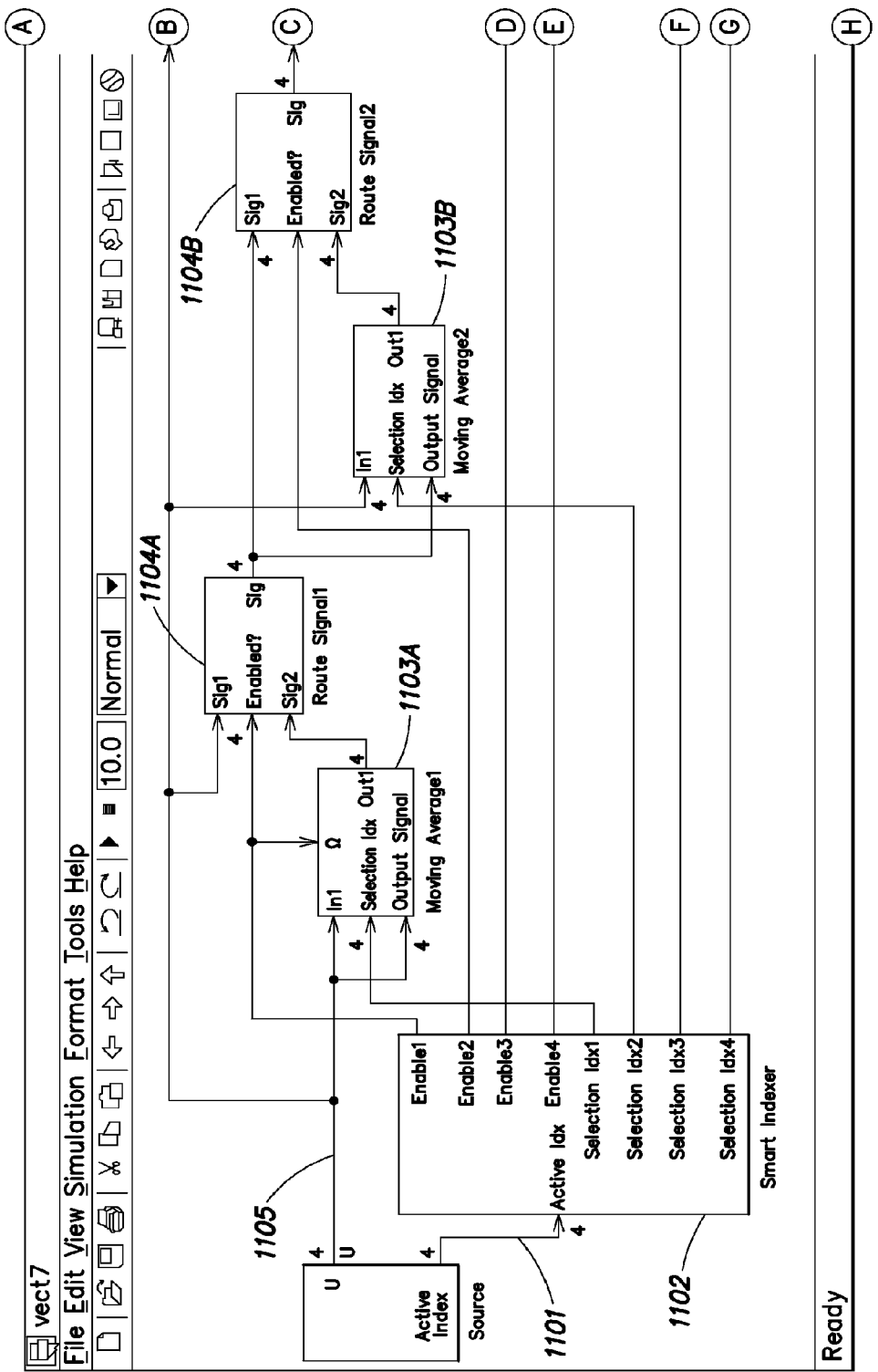
FIGS. 11A, 11B and 12 illustrate examples of models of systems that are based on the system illustrated in FIG. 7 and including a smart indexer.
Figure 11B:
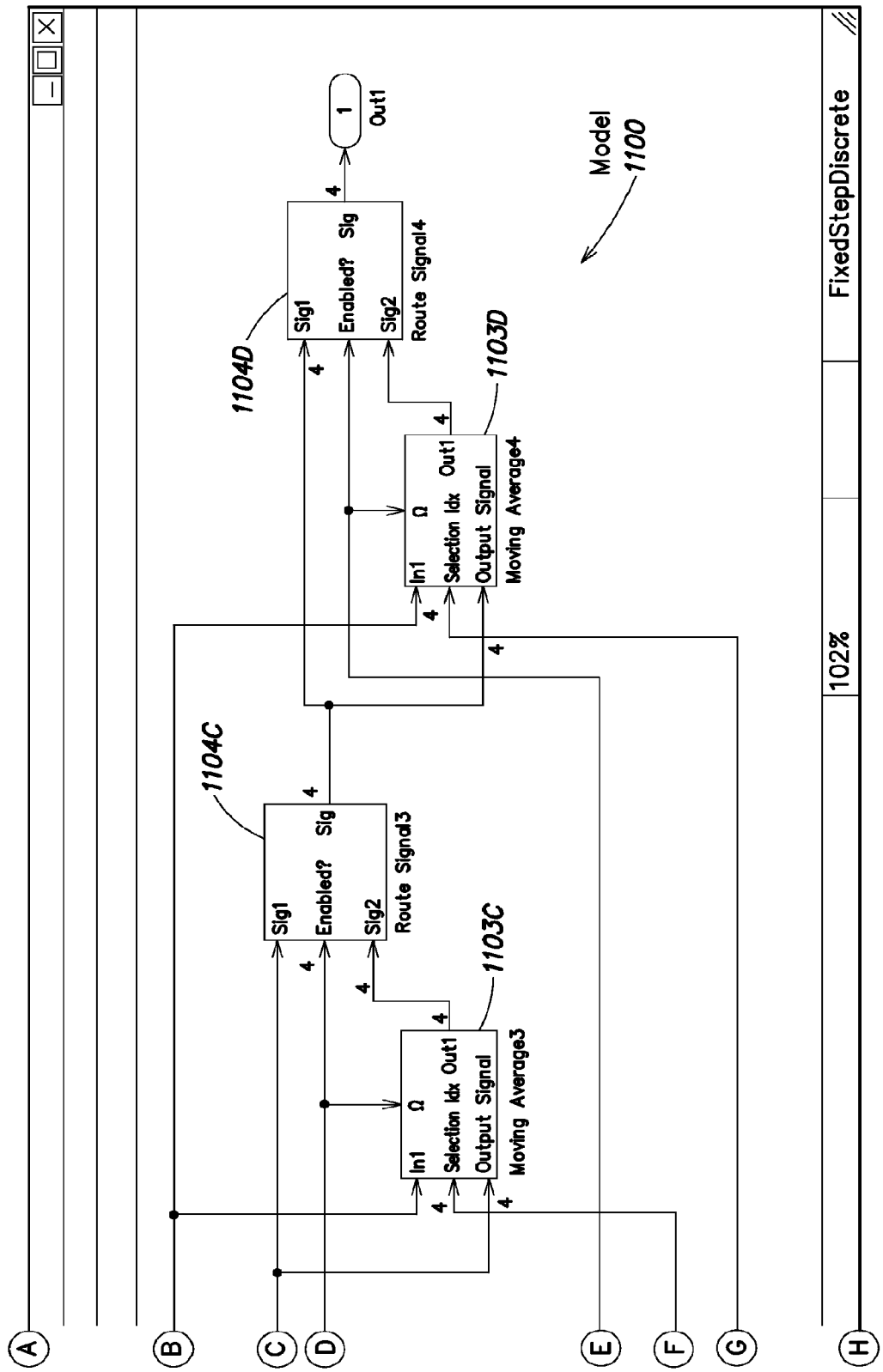
Figure 12:
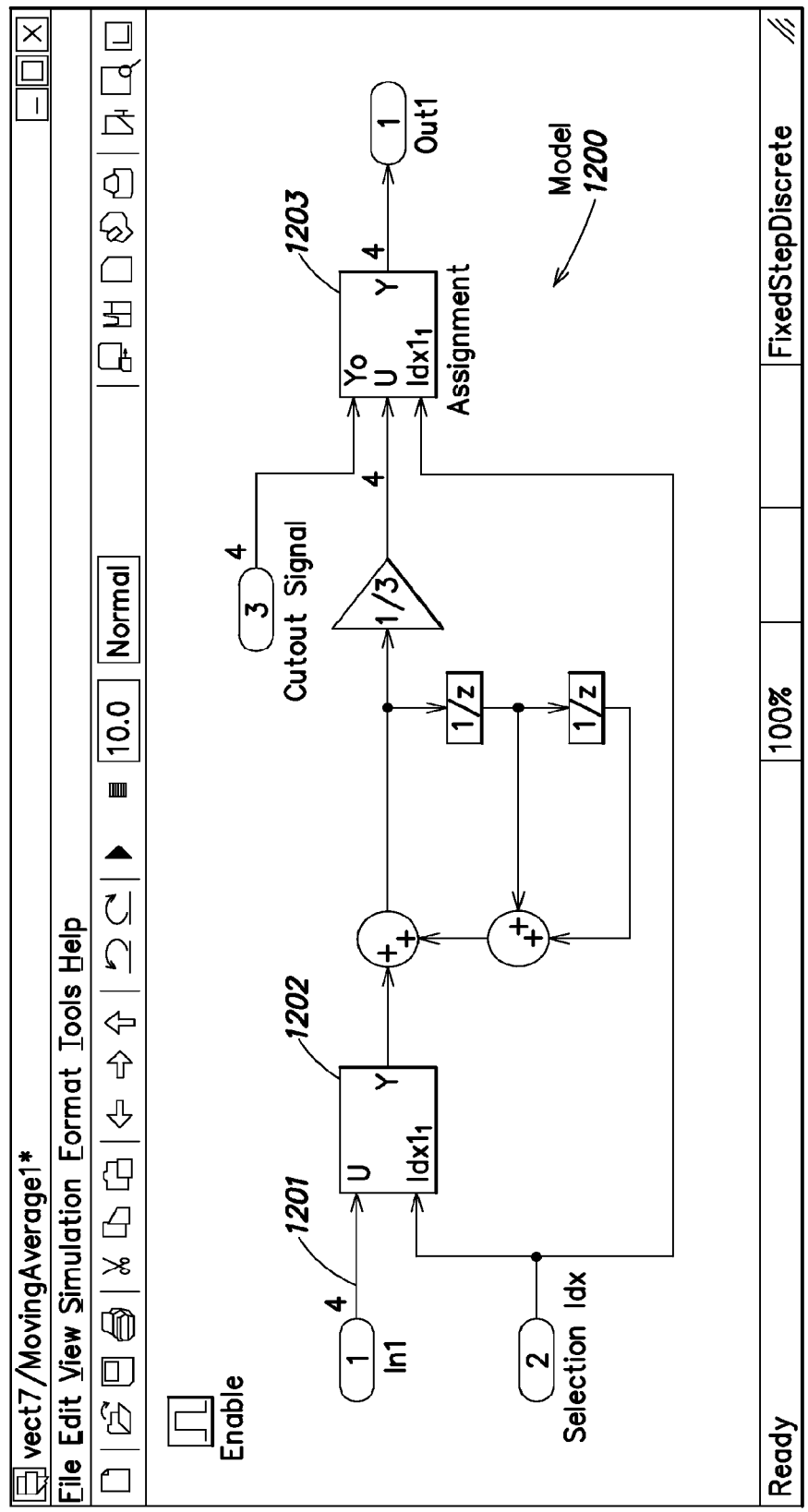

As shown in FIGS. 11A and 11B, the contents of a number of subsystems may be responsible for computing a moving average and the subsystems may have identical contents. Model 1100 of FIGS. 11A and 11B shows a system having a number of Moving Average subsystems 1103A-1103D. An example of the contents of the Moving Average subsystems 1103A-1103D are shown in FIG. 12. Model 1100 also includes a number of Route Signal blocks 1103A-1103D that are responsible for correctly routing signals among the Moving Average subsystems 1103A-1103D.

FIG. 12 shows example contents of a Moving Average subsystem (e.g., block 1103A-1103D). As in the example discussed above, system 1200 includes selector and assignment blocks (e.g., Selector block 1202 and Assignment block 1203).

Referring to FIGS. 11A and 11B, in model 1100 a source block that is responsible for producing a variable-sized signal may also be responsible for producing an Active Index signal 1101. Signal 1101 may have a size of four regardless of the size of the signal "u" 1105 (or equivalently signal 1201) at any given time step. Elements of the "Active index" signal 1101 may indicate which of the four received signals are active at any given time. Using this information, "Smart Indexer" block 1102 may produce four enable signals for each of the four Moving Average subsystems 1103A-1103D. These enable signals may activate a corresponding subsystem only if, e.g., the signal element corresponding to that moving average subsystem is currently active. Additionally, the enabling signal may also be used to re-aggregate results of the moving average subsystems in a correct order using "Route Signal" blocks 1104A-1104D. "Smart Indexer" block 1102 may also produce selection indices for the moving average signal so that model 1100 may process the appropriate signal element. Note once again that neither the Iterator nor the Block Processing constructs provide a mechanism for simplifying the example shown above.

Although model 1100 may work for its intended purpose, its complexity may be high and readability of the model 1100 may suffer. Furthermore, transforming model 1100 to highly efficient code may be very difficult. Therefore, a higher-level of abstraction for applying the moving average (or any other appropriate dynamic system) to elements of a signal may be needed.

Variable-sized signals may be used in various domains, such as video processing, radar processing and signal processing domains. For instance, in such domains, many application scenarios may demand that objects in a scene be tracked (e.g., aircraft on a radar screen, vehicles on a highway, etc.). Such tracking applications may be implemented using variable-sized signals where the signal sizes may correspond to a number of objects being tracked at any given time. Each tracked object may generally be processed identically. For example, each object may be processed using a Kalman filter that tracks a trajectory of the object being tracked. Since the objects may generally be processed identically, it may be convenient to have a programming block that performs the same processing over each element of variable-sized signals associated with the objects.

Implicit Iteration

According to one embodiment, a function referred to herein as "implicit iteration" may be used to allow iteration over input/output signals of a block based on the signals' dimensions. Further, a block supporting such an implicit iteration function may also be capable of indexing over states of a system, thereby may provide a unique set of states for each iteration. In an embodiment of the invention, the number of iterations performed by a block that performs implicit iterations may depend on at least one dimension associated with the input signal or output signal. In an embodiment, a block that is capable of performing implicit iteration may store states for each iteration. Such states may or may not be used to determine values of a block function of later states, but in any case, the block may store such states if they are needed. Further, according to an embodiment, a block may be configured to permit iterations to be indexed at a port level, rather than at a block level. In this way, more control may be provided over an iteration function in a block diagram environment, and, as a result, a more useful and simpler design may be achieved.

In conventional graphical programming environments, such as that provided by the Simulink® software product, there may be many types of hierarchical nodes, wherein each hierarchical node is a system. In a graphical programming environment having a hierarchical system, there may be one or more systems defined that contain other systems (e.g., subsystems or referenced via a Model block). For instance, a graphical programming environment may contain systems called virtual subsystems and non-virtual subsystems, where atomic (or non-virtual) subsystems are executed first before other block types are executed. For example, these non-virtual subsystems may include conditional subsystems such as Trigger, Enable, Enable with Trigger, Function-Call, Action (If or Switch-Case), For, and While subsystems. A model in the hierarchical graphical programming environment may also contain an "encapsulated system" that may make reference to another model. The "encapsulated system" may be called a Model Block and this encapsulated system may also be referenced by other blocks. These hierarchical nodes may also be systems that can be referenced by other blocks.

In a modeling environment, a new capability may be provided to address limitations of today's modeling environments. In particular, a new type of subsystem may be provided referred to herein as an "Implicit Iterator Subsystem" (or alternatively "Implicit Iterator System"). An Implicit Iterator Subsystem may also be specified in a model and referenced by a Model Block.

The general term "Implicit Iterator System" as used herein may be used to describe such a modeled system (or subsystem) because the number of iterations may be defined by signal size (dimension) and not by a number (e.g., an "Iteration limit" parameter in a "For Iteration" Subsystem that specifies the number of loops executed) or a condition signal (e.g., a condition of a "While" subsystem that determines how many times a loop should be executed) Implicit Iterator Systems can refer to hierarchy as in an Implicit Iterator Subsystem, an Implicit Iterator Model block that is referencing another model, an Implicit Iterator State Chart, Implicit Iterator Flow Chart, or a basic block such as an Implicit Iterator Block that itself contains no blocks. It should be appreciated, however, that although the examples discussed below may relate to the environment provided by the Simulink® software product, other graphical programming environments may use similar programming constructs.

According to an embodiment, the number of Implicit Iterator Systems implicitly determine the number of iterations performed by iterating over the input/output signals based on their dimensions and also index over the states of the system, where each block or element within the Implicit Iterator System may choose to have separate states for each iteration or a shared state used across each iteration. One benefit of Implicit Iterator Systems is that they may automatically update the number of iterations performed when, e.g., a user adjusts input and/or output signal dimensions.

Figure 13:
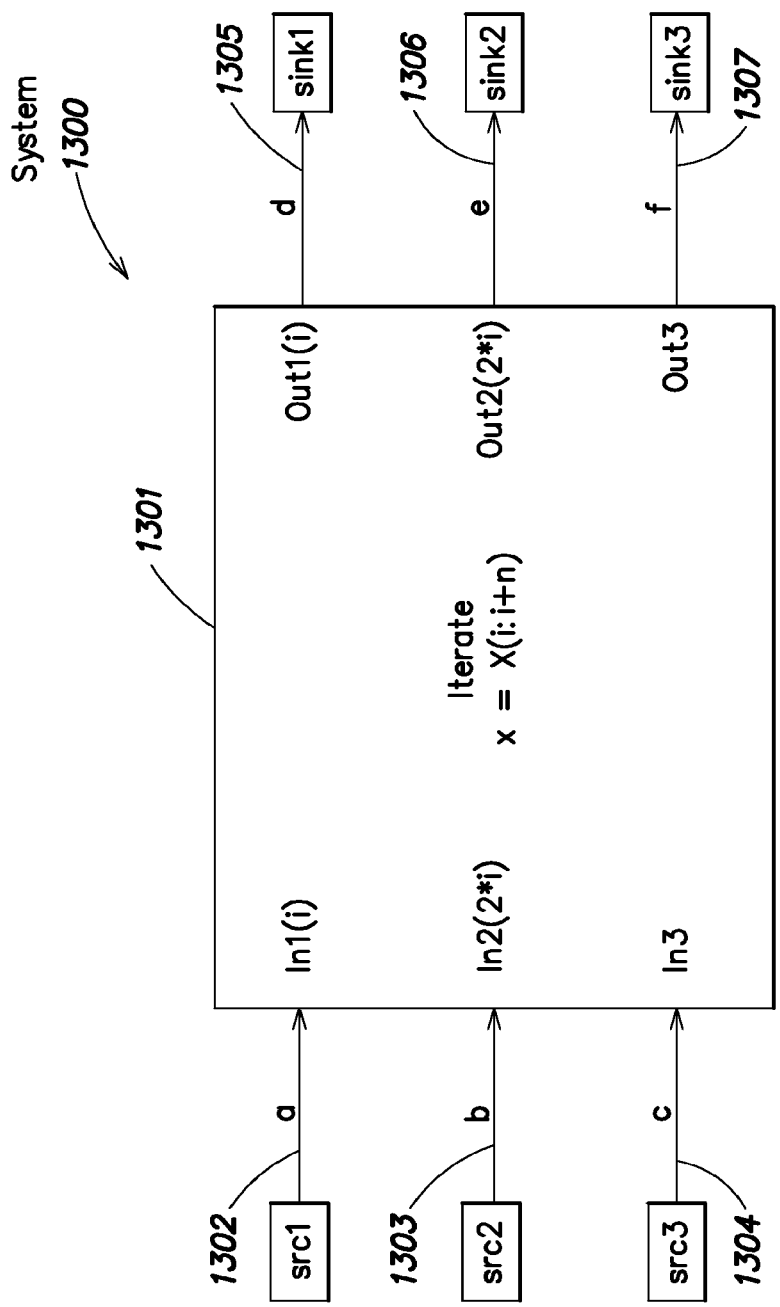
FIG. 13 illustrates examples of models of systems that are based on the system illustrated in FIG. 7 and including a smart indexer.

According to an embodiment, an indexing operation may be defined on input ports and output ports of a subsystem. For instance, the indexing operation may be defined on Inport (input port) and Outport (output port) blocks found within subsystems. In an example system 1300 shown in FIG. 13, a subsystem block icon 1301 representing a system may be defined wherein the first input signal (e.g., signal "a" 1302) may be indexed by its corresponding port on every element, the second input signal (e.g., signal "b" 1302) may be indexed two elements at a time, and the third input port may not index its input signal (e.g., signal "c" 1304). In the example system 1300, the output ports may be indexed in a similar manner. This constrains the dimensions of the signals "a" (1302) and "d" (1305) to be the same size. According to this example, signals "b" (1303) and "e" (1306) should be twice the size of "a" (1302) or "d" (1305). Signals "c" (1304) and "f" (1307) may not be constrained by the indexed subsystem. However, according to one embodiment, they may be constrained by blocks within the subsystem.

Figure 14:
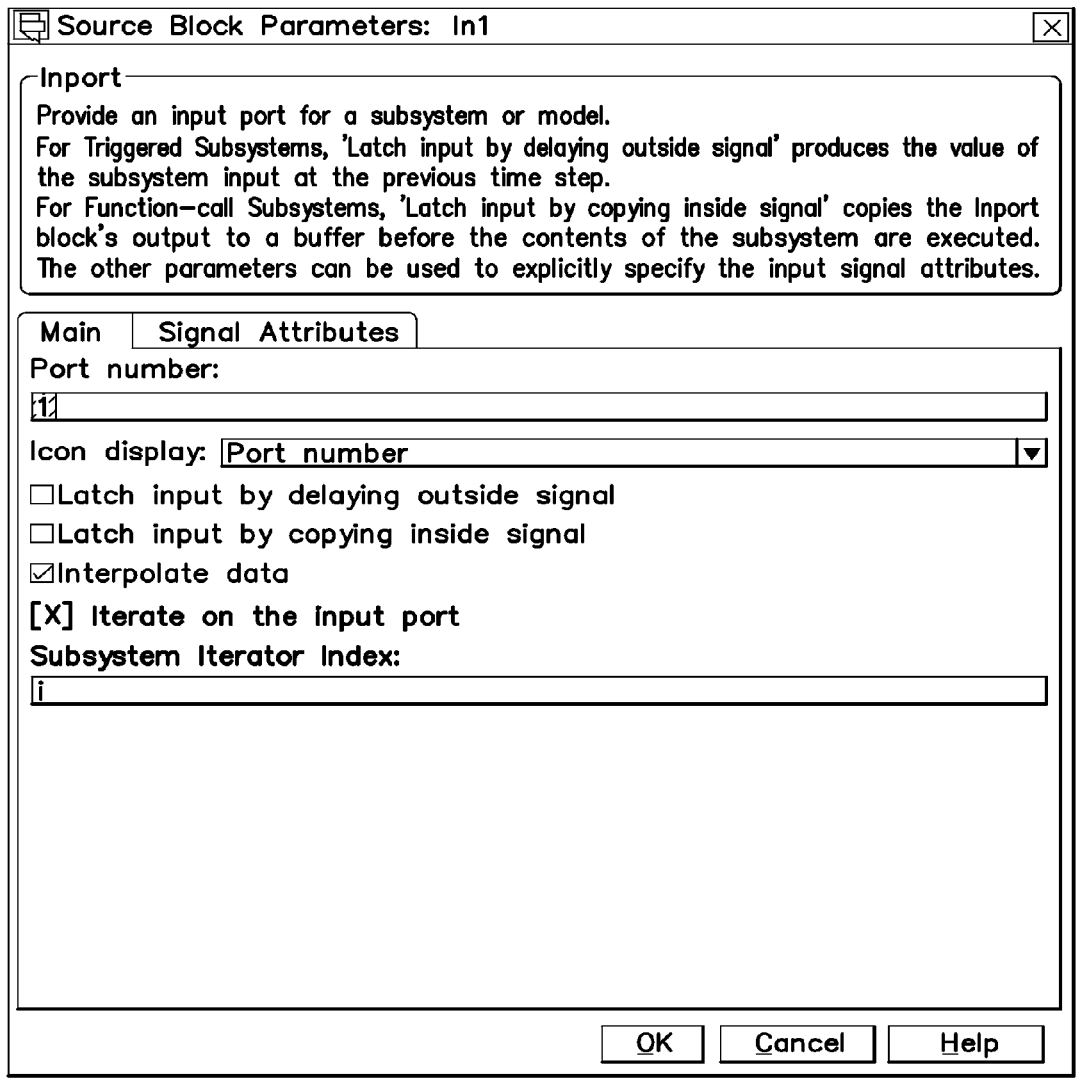
FIG. 14 illustrates an example user interface that may be used to configure iteration functions.

According to an embodiment, an interface (e.g., a dialog box) may be provided that permits, for example, a user/programmer to configure the Implicit Iterator System. FIG. 14 shows an example dialog box interface that may be used to configure an Implicit Iterator Subsystem according to an embodiment. In an embodiment, a dialog box for the Inport and Outport blocks may contain a field specifying an index criterion.

Figure 15:
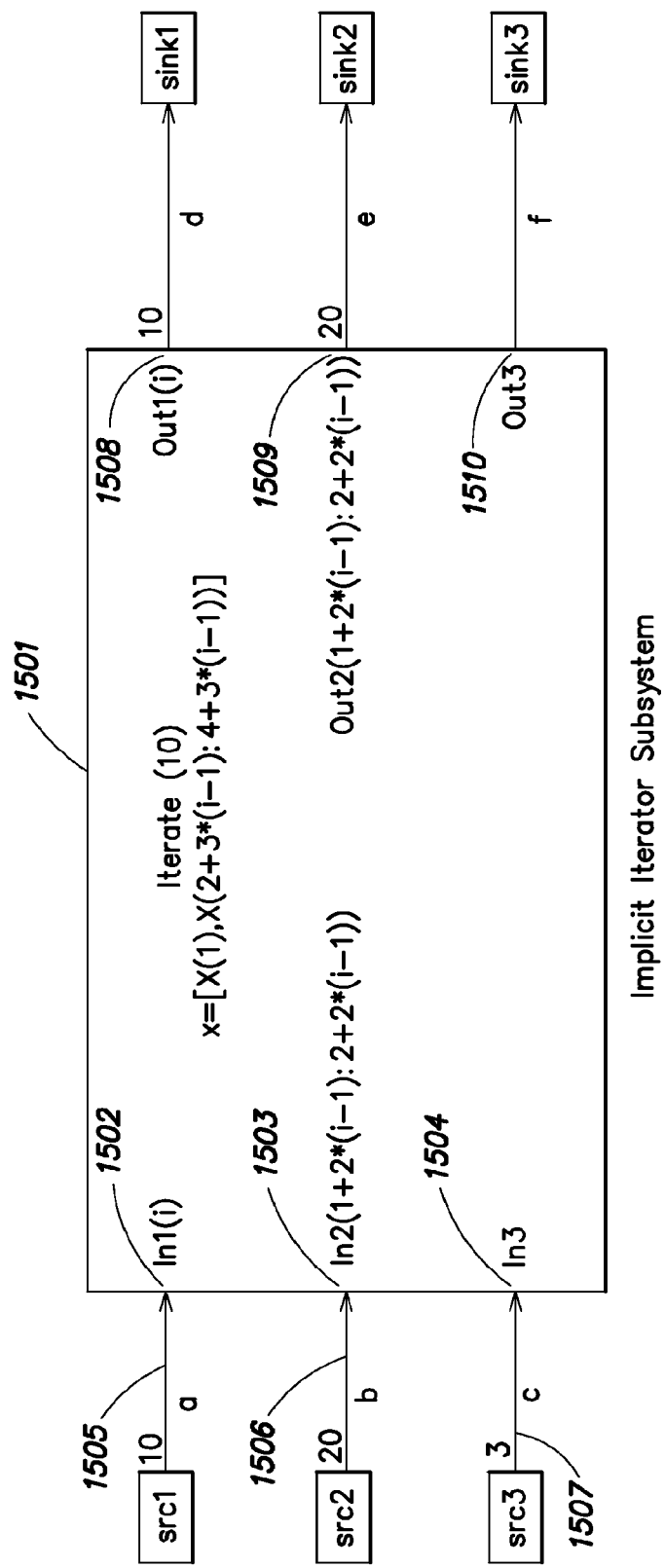
FIG. 15 illustrates an example block diagram that may be implemented in accordance with an embodiment of the invention.

FIG. 14 shows an example dialog box of a first Inport block ("In1") of the example shown in FIG. 15. This dialog may be obtained, for example, by selecting a control associated with a block diagram showing block 1501 of FIG. 15. For instance, the dialog box may be shown in response to a user/programmer selecting (e.g., by double-clicking with a pointing device) the Inport "In1" block of FIG. 16 corresponding to the first input port of FIG. 15. Alternatively, one can use any method for accessing block parameters in any of a number of block programming environments.

In the example dialog box shown in FIG. 14, a user may select to iterate on an input port Inport block ("In1")(e.g., by the user selecting the option within the dialog box). When this feature is selected, the 'Subsystem Iterator Index' that defines how the subsystem is indexed may be specified as "i" meaning the first dimension. According to an embodiment, index variables for iteration are i, j, k, l, m, n, o, p, . . . for each dimension by default. The index variable names may be changed via an interface, for example, by selecting an option on the Implicit Iterator Subsystem block representation (e.g., item 1501 of FIG. 15).

As shown in FIG. 15, indexing values may be represented using conventional indexing notation (e.g., MATLAB indexing notation), with (i) indicating (i+N) where "N" is the internal width of the signal as required by the block to which the Inport is connected. To explicitly specify the width of an indexer, the well-known colon operator as used in the MATLAB® software package may be used, e.g., (i) for Inport In1 of FIG. 16 with label (1502) on the Implicit Iterator Subsystem icon 1501 and (1+2*(i−1):2+2*(i−1)) for Inport In2 of FIG. 16 with label (1503) on the Implicit Iterator Subsystem icon 1501.

After propagating signal dimensions, representation 1501 (e.g., an icon displayed to the user) may be updated to indicate the dimensions and how many times the index system will loop. For instance, the indexed system (e.g., the system as represented by block 1501) may iterate ten times where a states vector is of length three.

As shown in the example in FIG. 15, block 1501 receives a signal "a" (1505) of width ten, signal "b" (1506) of width twenty, and a signal "c" (1507) of width three. Block 1501 includes three Inports, Inport In1(i) 1502, In2(2*i:2*i+2) 1503, and In3 1504. Block 1501 also includes three Outports, Out1(i) 1508, Out2(2*i) 1509, and Out3 1510.

After propagating signal dimensions, a representation of block 1501 (e.g., an icon displayed to the user within a programming interface) may be updated to indicate the dimensions and how many times the index system will loop. For instance, the indexed system (e.g., the system as represented by block 1501) may iterate ten times where the states vector is of length three.

Figure 16A:
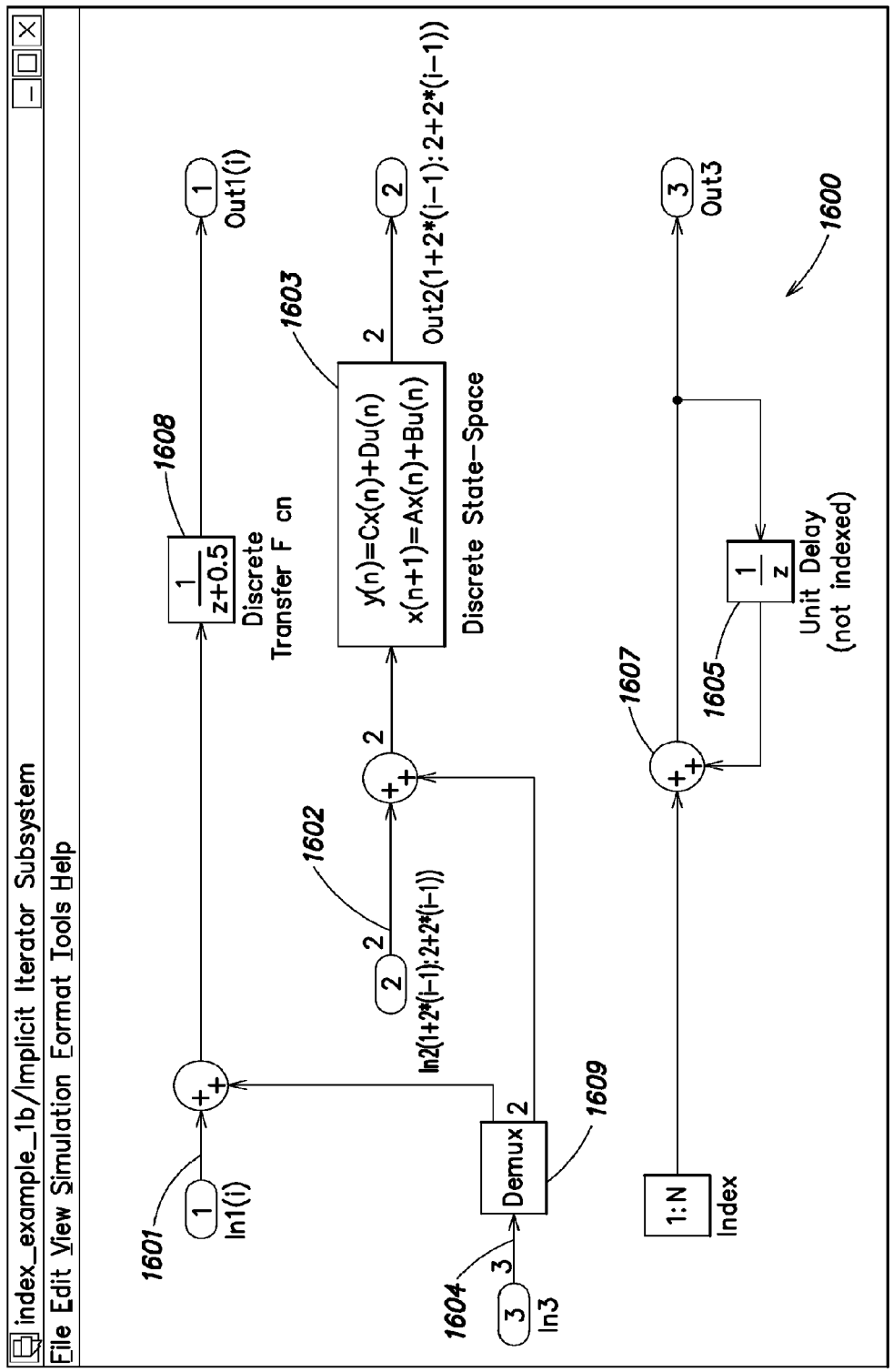
FIG. 16A illustrates an example subsystem and associated interface in accordance with an embodiment of the invention.

Continuing with the example of FIG. 15, the contents of the indexed subsystem may appear as shown for example, in FIG. 16A. FIG. 16A shows an indexed subsystem 1600 that includes a Discrete Transfer Function block 1608, a Discrete State-Space block 1603, a Demultiplexer block 1609 and a Unit Delay block 1605. Within the subsystem 1600, the signal from the first input port (1601) is of width one and Discrete Transfer Function block 1608 has one state. The second input signal (1602) is of width two and Discrete State-Space block 1603 has two states. The third input signal (1604) is of width three and is connected to a Demux block 1609. An Index block providing the current value of the iteration is connected to a sum block 17607, which is connected to a unit delay block 1605, having one state. Furthermore, on unit delay block 1605, according to an embodiment, a property may be selected by, e.g., the user, indicating that the block should not be indexed.

Because of the signal dimensions (of signals "a", "b", "c", "d", "e", and "f" in FIG. 15), a subsystem that performs implicit iteration according to one aspect may loop ten times, and with each iteration, a new state vector, "x", may be switched in (e.g., a vector having a number of assigned values). That is, in this example, "x" is of length 1+3 for each iteration and "X" for the Implicit Iterator Subsystem is of length 1+10*3=31. The first element of "x" may not change in each iteration; the remaining elements may switch between the different banks within state vector "X". This is why the indexing of state vector "X" may be shown as [X(1),X(2+3*(i−1):4+3*(i−1)], i.e., an iteration uses a different set of states. The first iteration (i==1) may use [X(1),X(2:4)], the second iteration (i==2) may use [X(1),X(5:7)], and so forth. Each block with state may specify whether or not the block states are shared across the iterations or iteration specific. This specification can be configured by the user. For example, the user could open a dialog box associated with the block and select an option to specify that the blocks' state are shared or iteration specific. In our example, the states of the Discrete Transfer Function 1608, the Discrete State Space, 1603 are iteration specific and are associated with the Implicit Iterator Subsystem states X(2+3*(i−1)) and X(3+3*(i−1):4+3*(i−1)) respectively. Furthermore, the Unit Delay 1605 block state was configured by the user to be shared and is associated with X(1).

According to an embodiment, when saving the results of the simulation (e.g., by logging states), the state vector, "X", may be saved for the implicit iterator subsystem in a way such that the individual states of the blocks within the implicit iterator subsystem can be easily identified. For instance, meta-data may be provided enabling one to identify the elements of "X" that belong to a particular iteration.

If parameters for the source or sink blocks (or different blocks) were specified, then the dimensions of "a", "b", "c", "d", "e", and "f" may differ, and the number of iterations may not be ten. In an embodiment, the contents of an implicit iterator system may not change when the dimensions of signals connected to the implicit iterator system change. Here, the dimensions of the signal may affect a number of iterations performed by the implicit iterator system. For example, if src1 output signal 1505 has a vector dimension of 30 and src2 output signal 1506 has a vector dimension of 60, then the Implicit Iterator Subsystem 1501 will implicitly adjust the number of iterations to 30. This automatic propagation of signal dimensions to number of iterations helps simplify modeling by allowing, e.g., that less information be entered. For example, the conventional For Iterator Subsystem required that a user manually adjust the number of iterations each time signal dimensions change. The Implicit Iterator Subsystem 1501 does not have this requirement because it automatically adjusts the number of iterations when a time signal's dimension changes.

Within a subsystem implementing implicit iteration functions (e.g., block 1501), one can use an Index block to obtain a current value for the index variable. In this example, the index variable may be used to sum values produced by the Index block of FIG. 16A where iterator starts at one and goes to ten, e.g., the output signal of the Index block may be 1+2+3+4+5+6+7+8+9+10.

In an embodiment, a configuration of a block (e.g., a Unit Delay block 1605 or any block with state) may be such that the block may request that its states be reset after each execution of the subsystem implementing implicit iteration functions (e.g., subsystem 1600). In an embodiment, prior to an iteration, a block associated with state may be directed to reset its state to an initial condition. According to an embodiment, a block associated with state in an implicit iterator subsystem can have an option that can be specified via a dialog or other method (e.g., programmatic interface) that may specify if the states for the block are iteration specific, or if the states are shared across iterations.

Example SimLoop pseudo-code illustrating the time-based semantics of block diagram models includes solving the equations (functions) associated with the blocks. Blocks may contain Output, Update, and Derivative functions. For example implicit Iterator Systems may contain Output, Update, and/or Derivative functions. The SimLoop may include the following:

SimLoop
  Outputs
  Update
  Integrate
EndLoop

Each block may be a dynamic system comprising run-time methods, e.g., Output, Update, Derivatives (and others, such as zero crossings, etc.).

According to one aspect, a simulation loop may be extended in order to process subsystems implementing implicit iteration functions. For example, below is pseudo code for one such model in FIGS. 15 and 16A:

SimLoop
  Outputs
    a=src1( )
    b=src2( )
    c=src3( )

```
ImplicitIteratorSubsystem_Output(a,b,c,d,e,f,X,t)
    sink1(d);
    sink2(e);
    sink3(f);
    Update
    ImplicitIteratorSystem_Update(a,b,c,d,e,f,X,t)
    Integrate
EndLoop
ImplicitIteratorSubsystem_Output(a,b,c,d,e,f,X,t)
    For i=1:10
    ImplicitIteratorSubsystem_OutputBody(i,a(i),b(1+2*(i-
1):2+2*(i-1)),c,d(i),e(1+2*(i-1):2+2*(i-1)),f,X(1),X(2+3*
(i-1):4+3*(i-1)),t)
    End
ImplicitIteratorSubsystem_Update( )
    For i=1:10
    ImplicitIteratorSubsystem_UpdateBody(a(i),b(1+2*(i-
1):2+2*(i-1)),c,X(1),X(2+3*(i-1):4+3*(i-1)),t)
    End
ImplicitIteratorSubsystem_OutputBody(i,in1,in2,in3,out1,
out2,out3,f,xshared,x,t)
    sum1=in1+in3(1);
    Out1=x(1); # Discrete-transfer function output
    sum2=in2+in3(2:3);
    Out2=A*x(2:3)+B*sum2; # Discrete State-Space output
    unitDelayOut=xshared; # Unit Delay (not indexed)
    sum3=i+unitDelayOut;
    Out3=sum3;
ImplicitIteratorSubsystem_UpdateBody(i,in1,in2,in3,
xshared,x,t)
    x(1)=sum1−0.5*x(1); # Discrete-transfer function update
    x(2:3)=C*x(2:3)+D*sum2; # Discrete State-Space update
    xshared=sum3; # Unit Delay (not indexed)
```

The pseudo-code above may follow semantics of time-based block diagrams as defined by Control Systems Theory and Signal Processing engineering domains. Also, it is noted that in the example above, there are no continuous states, thus the Integrate portion is empty. If there were continuous states, an additional method, (e.g., a method implemented as a function) may be used to perform integration.

In an embodiment, indexing operations can be defined on the subsystem as opposed to using Inport or Outport block dialogs. In this case a dialog may appear for the subsystem block and the indexing may be specified for each input and output port of the subsystem in a tabular format.

Figure 16B:
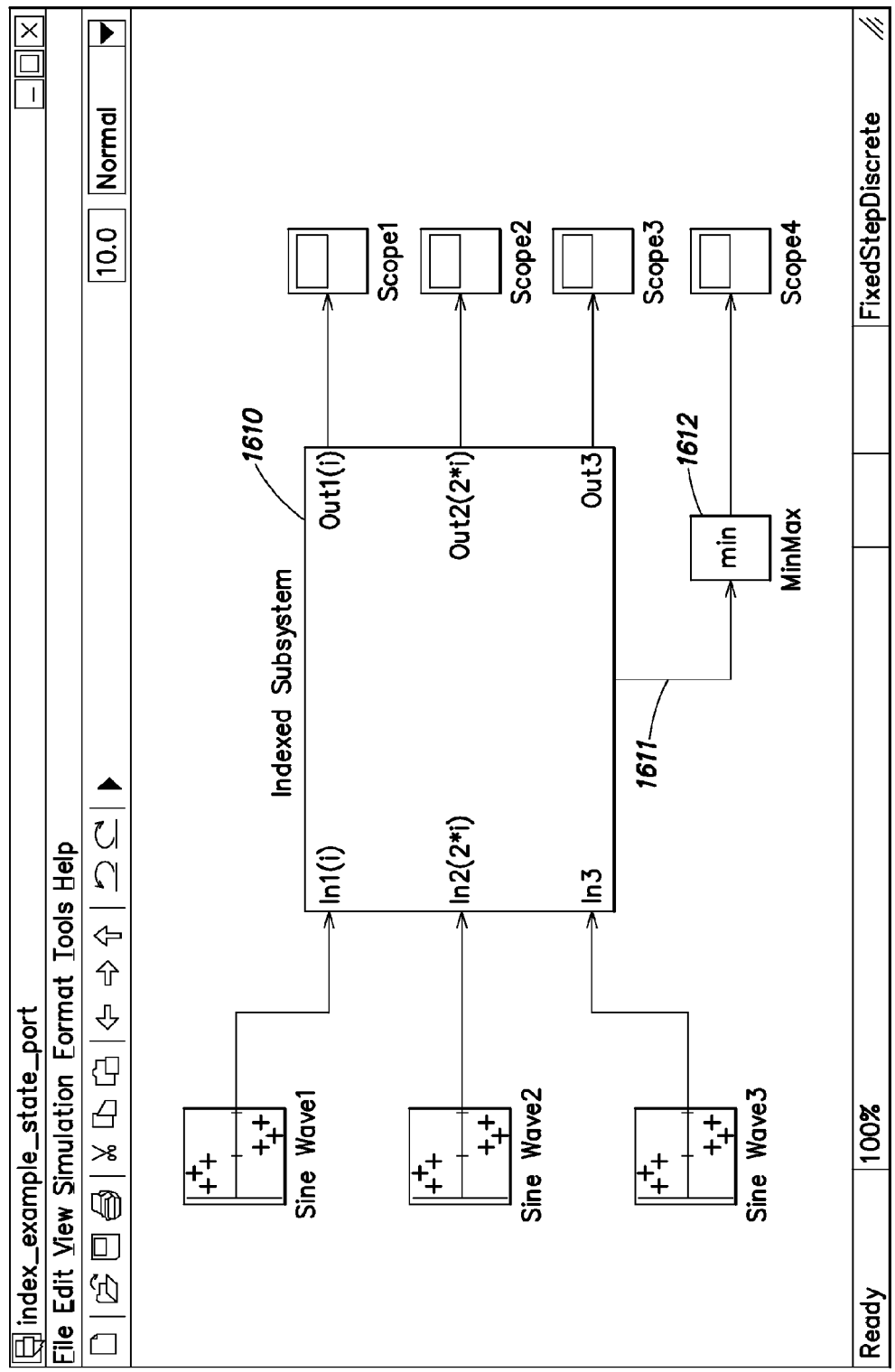
FIG. 16B illustrates an example subsystem and associated state port according to an embodiment of the invention.

According to an embodiment, systems that perform implicit iteration can be configured to have a state port. FIG. 16B shows an indexed subsystem 1610 that may perform implicit iteration, and may provide an output signal "X" (item 1611) via a state port. According to an embodiment, subsystem 1610 may provide a state output as output "X" (1611) which may be determined as a result of computations made after one or more iterations, and this signal can then be used by other blocks to perform other computations. For example, as shown in FIG. 16B, a MinMax block 1612 may be used to compute a minimum value at each time step across all states of subsystem 1610. Other states or determinations of states at particular iterations may be brought out as ports of a subsystem.

Figure 17:
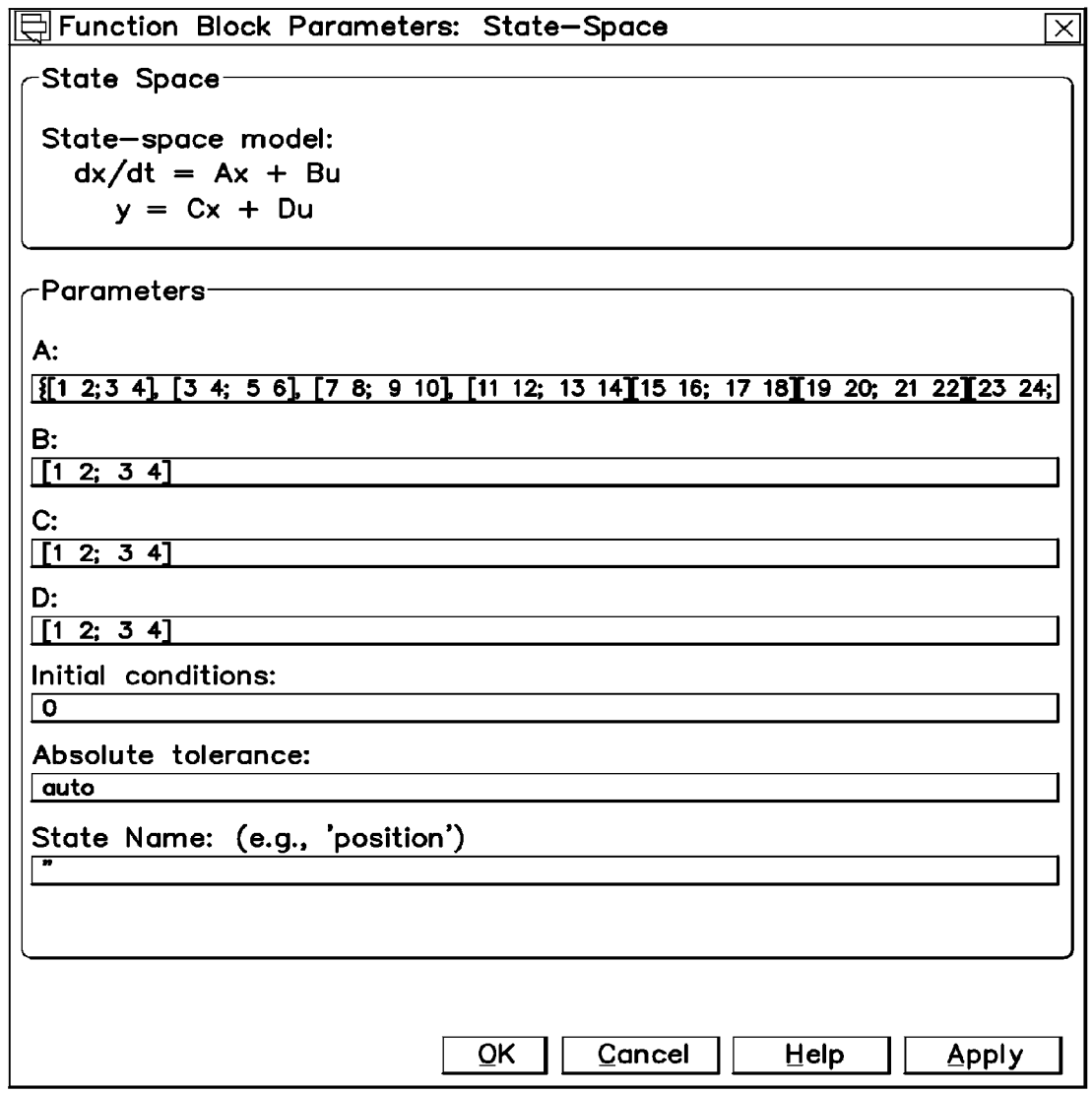
FIG. 17 illustrates an example interface used to configure an iterator subsystem in accordance with an embodiment of the invention.

Revisiting the above example, assume that it is desired to provide different "A", "B", "C", and "D" matrices for different iterations performed by an indexed subsystem. Recall from above that the system description of a state space block may be defined as:

$$\dot{X}(t)=A*X(t)+B*u(t)$$

$$Y(t)=C*X(t)+D*u(t)$$

Where "X(t)" is the state for the state space block, "u(t)" is the input signal and "y(t)" is the output signal. Matrix parameters, "A", "B", "C", and "D" can either be the same for all iterations of the indexed system, or, according to an embodiment, the user may specify what matrix parameters are used for certain iterations. For example, the user can specify via a configuration setting (e.g., in a dialog box, such as the one shown by way of example in FIG. 17) that the "A" parameter may be indexed and the user may use notation such as MATLAB® cell notation to provide values for 10 different 2×2 matrices for "A", one for each iteration, such as:

{[1 2; 3 4], [3 4; 5 6], [7 8; 9 10], [11 12; 13 14] [15 16; 17 18] . . .

[19 20; 21 22] [23 24; 25 26] [27 28; 29 30] [31 32; 33 34] [35 36; 37 38]}

If for instance, it is desired that on the first iteration, that a parameter contain the values [1 2; 3 4], on iterations 3 and 4 the values [7 8; 9 10], and on the remaining iterations the values [4 4; 5 5], the following example notation may be used:

{{1,[1 2; 3 4]}, {3:4, [7 8; 9 10]} {−1,[4 4; 5 5]}} Note that in this notation, the iteration, to which the values apply for the particular parameter, is specified prior to the values used for that iteration. Also note that in this notation, an iteration value of "−1" indicates that the values that follow apply for all successive iterations. It should be noted that this is just one example of a notation that may be used to specify values for particular iterations. Other notations, that specify values for particular iterations, may be used in other embodiments.

Indexed behavior may be enabled at the block level. For instance, if it is determined that the State-Space (SS) block of the Wheel subsystem as discussed earlier is sufficient, then there may be no need to place the block in a subsystem. Thus, it is possible to connect "Wu", "Wy" directly to the State-Space block and optionally have the diagram annotate that the SS block is operating in Implicit Iteration mode.

Figure 18A:
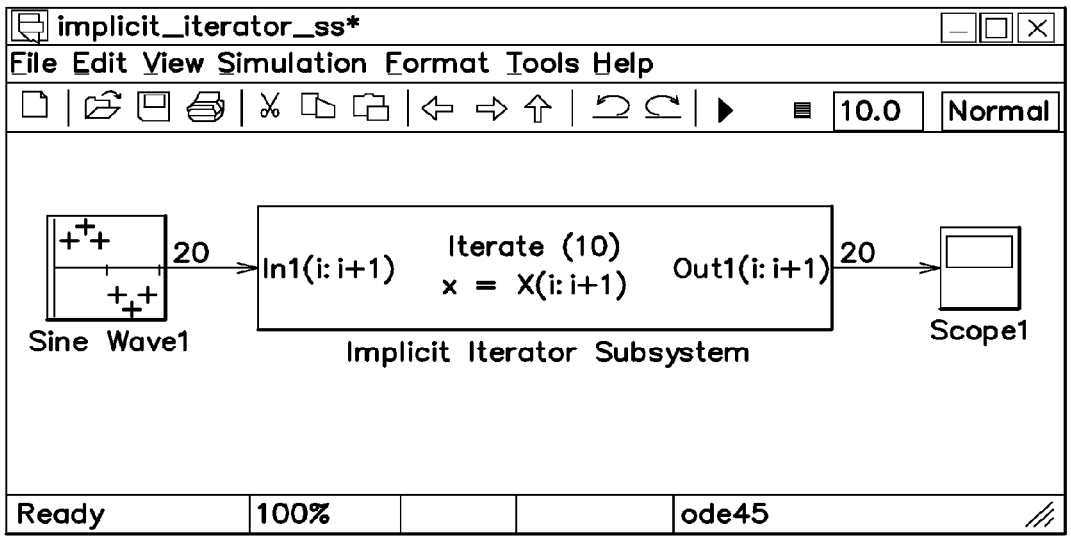
FIGS. 18A-18B illustrate example interfaces showing an implicit iterator subsystem in block diagram form and its associated state space representation.
Figure 18B:
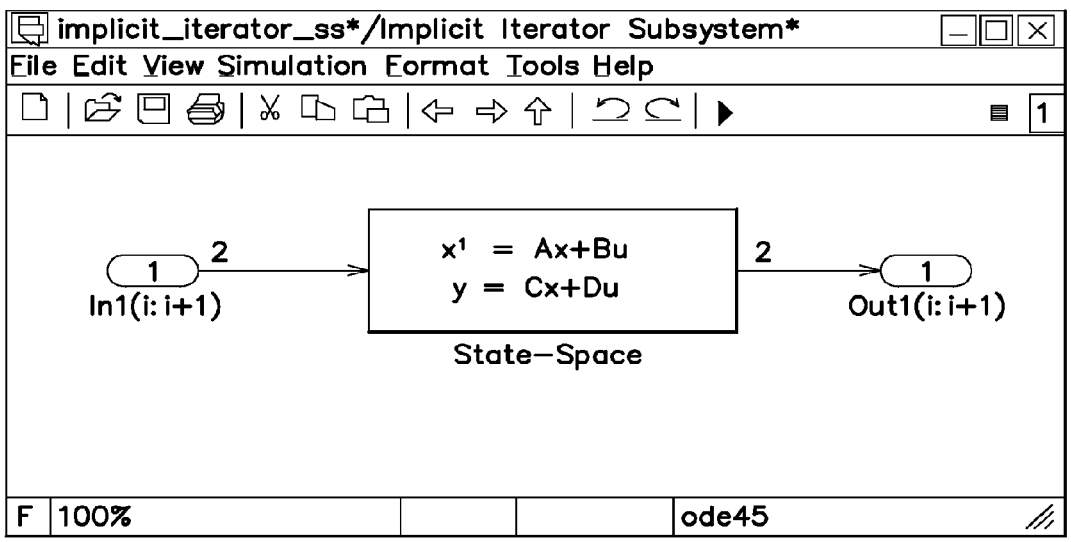
Figure 19:
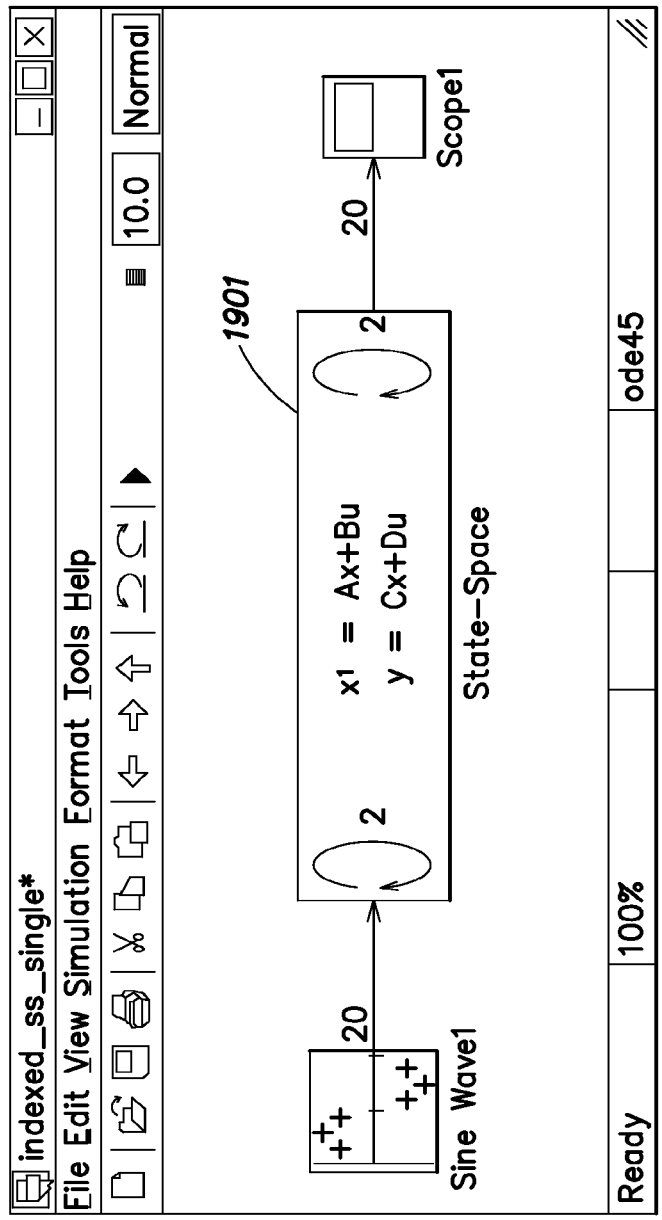
FIG. 19 illustrates an example of an interface that may indicate that a particular block performs an implicit iteration according to an embodiment of the invention.

Considering the example shown in FIGS. 18A-18B, the Implicit Iterator Subsystem (implicit_iterator_ss) may contain only one block. Allowing for individual blocks to be implicitly iterated may help simplify the modeling paradigm. That is, in the interface, a system may be a subsystem or block in a time-based block diagram. Here, the ports that are being implicitly indexed (e.g., the two "loop" images on block icon 1901) may be identified graphically as shown in the example of FIG. 19.

To enable implicit indexing of a signal, common services may be provided for all block types via a control associated with the block type (e.g., a dialog box) where indexing operations can be specified for the input/output ports of the particular block.

Figure 20A:
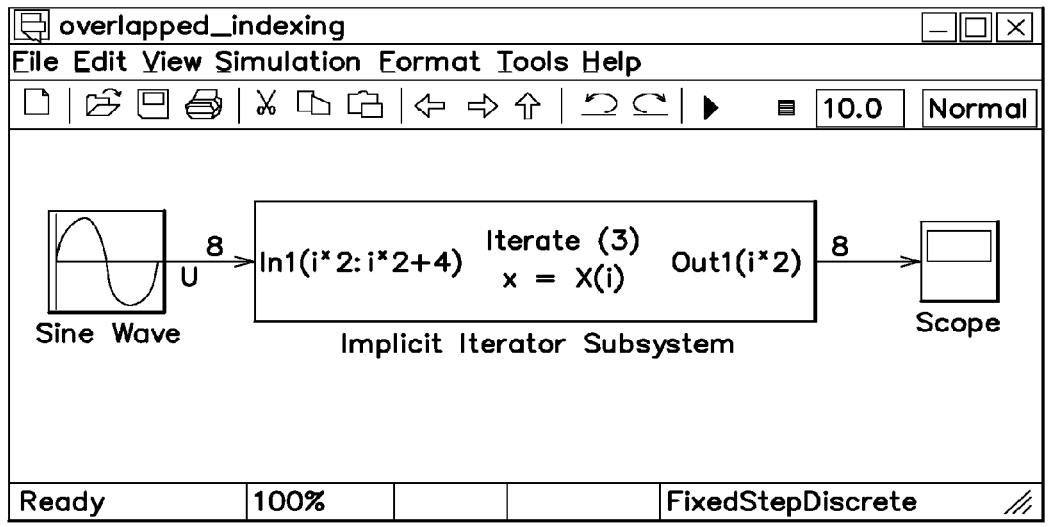
FIGS. 20A-20B illustrate an example implementation having overlapped indexing according to an embodiment of the invention.
Figure 20B:
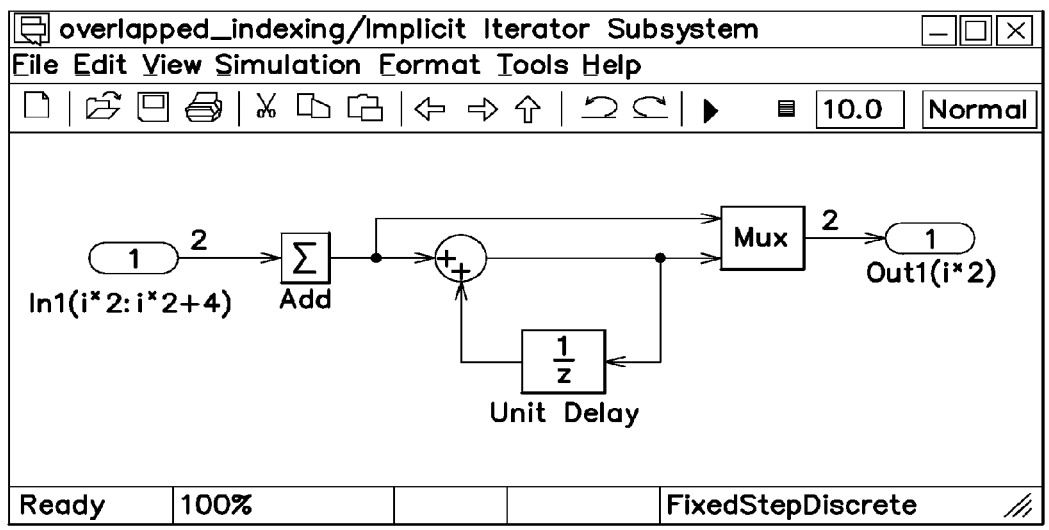

According to another aspect, it is appreciated that a user may want to have what is referred to herein as overlapped indexing. More particularly, there may be certain computations where previously determined elements may be used to determine values in the current iteration. For example, consider the following model implementing overlapped indexing as shown in FIGS. 20A-20B. Their input/output port specifications may be as follows:

Inport Index specification: 1+(i−1)*2:+(i−1)*2
Outport Index specification: i*2

Figure 21:
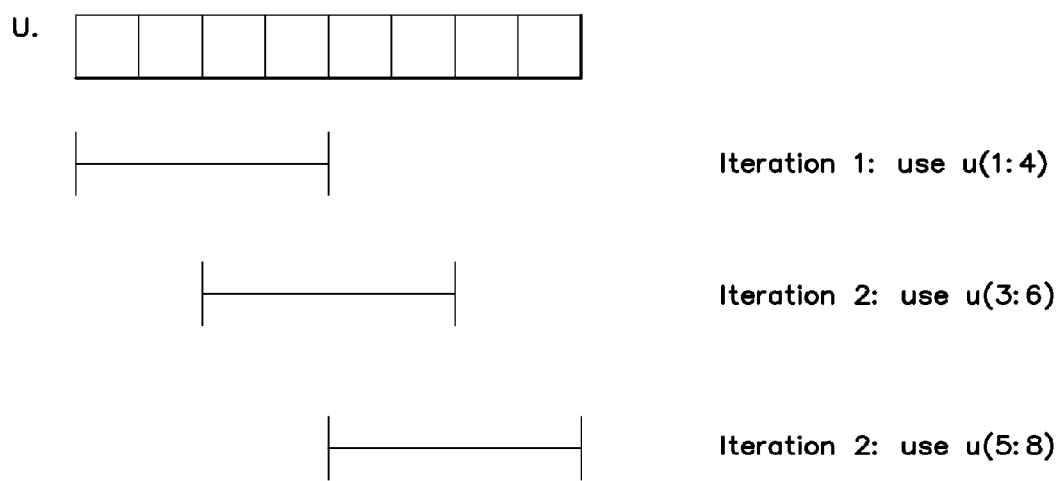
FIG. 21 illustrates an example of an overlapped indexing function according to an embodiment of the invention.

Here, four elements of the input signal, "u", are read, advancing by two at a time, as shown with more particularity in FIG. 21. For instance, in the first iteration, elements 1 through 4 of the signal corresponding to the Inport block are used (1:4), and in the second iteration, two previously-determined elements (elements 3, 4) are used to determine calculations in the second iteration along with elements 5 and 6, i.e., the second iteration uses elements 3:6. Thus, generally in this example, the Nth iteration uses the two elements that were used in the prior iteration plus the next two elements. This type of support may be used for calculating a modified moving average where information across iterations is used in the calculation. Any number of previously-determined values elements may be used, and such a configuration may permit designing more complex systems.

When overlapping indexing is not used, in-place operations can be supported fully. When overlapping indexing and in-place operations are used, one or more intermediate variables or other storage mechanism may be provided to store overlapping portions. That is, for values that may be overwritten, there should be some facility to store previous values that may be used in an overlapped computation.

Figure 22A:
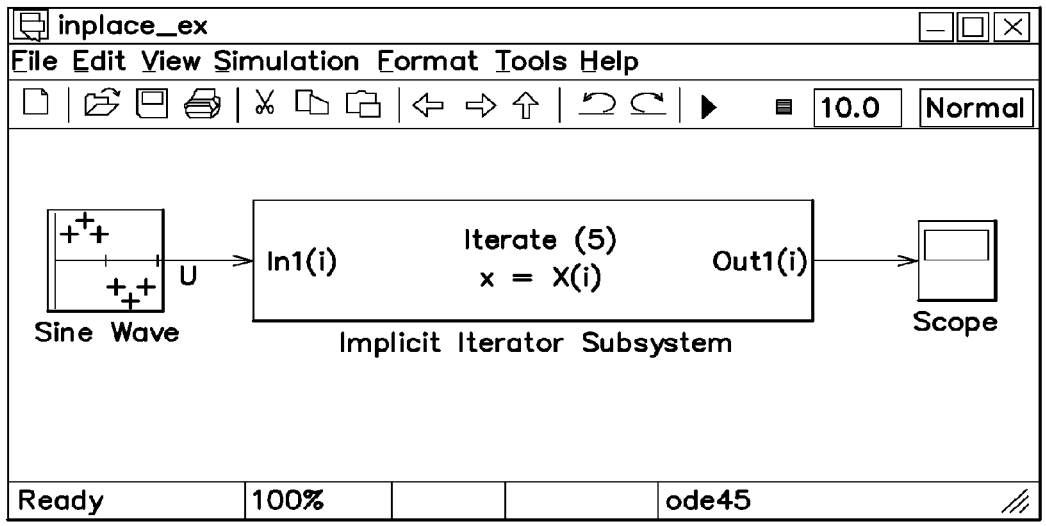
FIGS. 22A-22B illustrate an example implementation that may use in-place operations according to an embodiment of the invention.
Figure 22B:
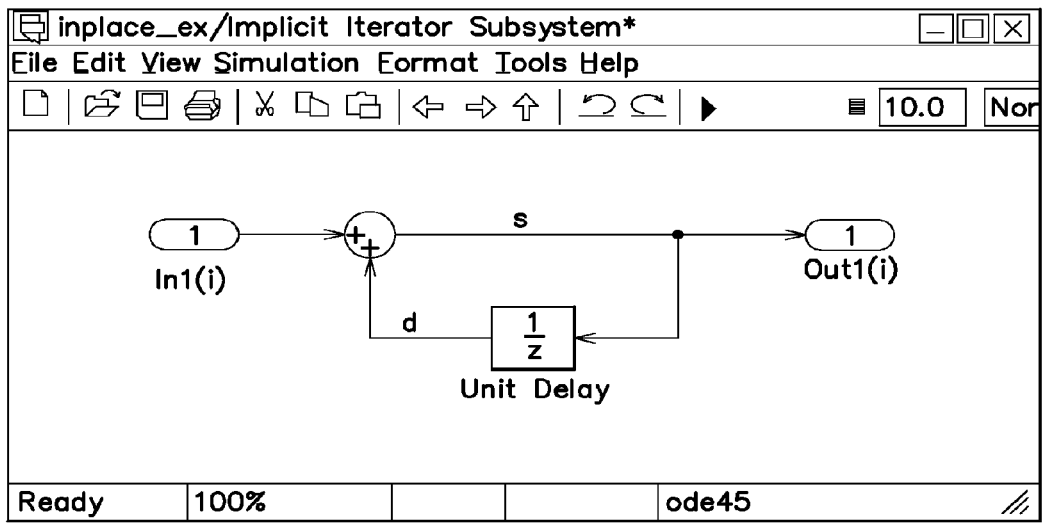

For example, consider the model as shown in FIGS. 22A-22B. In this model, an accumulation over time may be performed for each element of "U" using an Implicit Iterator Subsystem.

Assuming each signal state is a separate (persistent) variable that may be defined as:
ModelOutputs
U=SineWave(t);
For i=1:5
Implicit_Iterator_Subsystem_Output(U(i),Y(i),BWX(i));
End
Scope(Y); #Y represents the signal connected to the Scope of FIG. 22A
ModelUpdate
For i=1:5
Implicit_Iterator_Subsystem_Update(B(i),X(i))
End
Implicit_Iterator_ Subsystem_Output(In1, Out1,b, x)
d=x;
b.s=In1+d;
Out1=b.s;
Implicit_Iterator_Subsystem_Update(b,x)
x=b.s;

In the above, "B" represents a block I/O (signals of the diagram) and is a global of length five. Using variable reduction, redundant variables can be eliminated and operations may be performed in place. For example:
ModelOutputs
R=SineWave(t); # R==reused variable, currently representing U
For i=1:5;
Implicit_Iterator_Subsystem_Output(R(i),X(i))
End
Scope (R);
ModelUpdate
For i=1:5;
Implicit_Iterator_Subsystem_Update(R(i),X(i))
End
Implicit_Iterator_Subsystem_Output(r,x)
r=x+r;
Implicit_Iterator_Subsystem_Update(r,x)
x=r;

It should also be noted, that certain functions, such as the Output and Updated functions of the Implict Iterator Systems may (e.g., Implicit_Iterator_Subsysem_Output and Implicit_Iterator_Subsystem_Update) may be defined as inline functions that are expanded during compile time.

As discussed above, implicit indexing of vectors has been shown. It should be noted that implicit indexing may be applied to matrices as well. Generally, there may be two ways of handling multi-dimensional signals (2 or more dimensions). The first may be to use the same index over all dimensions of the matrix. For example, one could specify the Inport and/or Outport index operations using matrix indexing. For instance, consider 2 dimensions:
Input index specification: (i,j)
Where Implicit Iterator Subsystem will perform the following indexing operation:
For i=1:N
For j=1:M
SubsystemMethod(u(i,j))

Signals that are input into an implicit iterator system, in a block diagram, can have sizes that vary during each step of execution of the block-diagram. This may result in a variation of the number of iterations performed by the implicit iterator subsystem during each step in the execution. But as mentioned above, the number of sets of states maintained for processing by the implicit iterator subsystem may be equal to the number of iterations being performed. If during execution, the number of iterations is decreased as a result of reduction of the size of one of the input signals, it should be known which of the sets of states should be retained and used in the reduced number of iterations.

This functionality may be achieved, for example, by providing an additional "active indices" signal into the implicit indexing system. The active indices signal may be, for example, a vector signal whose size is equal to a maximum number of iterations to be performed by the implicit indexing system. In addition, the signal may include an indication of which iterations are deemed active for an execution step and which are not. For example, the signal may include a bit vector that contains ones at positions in the vector that correspond to iterations that are used (active) for the execution step and zeros at positions corresponding to iterations that are not used (inactive) for the execution step.

Figure 23A:
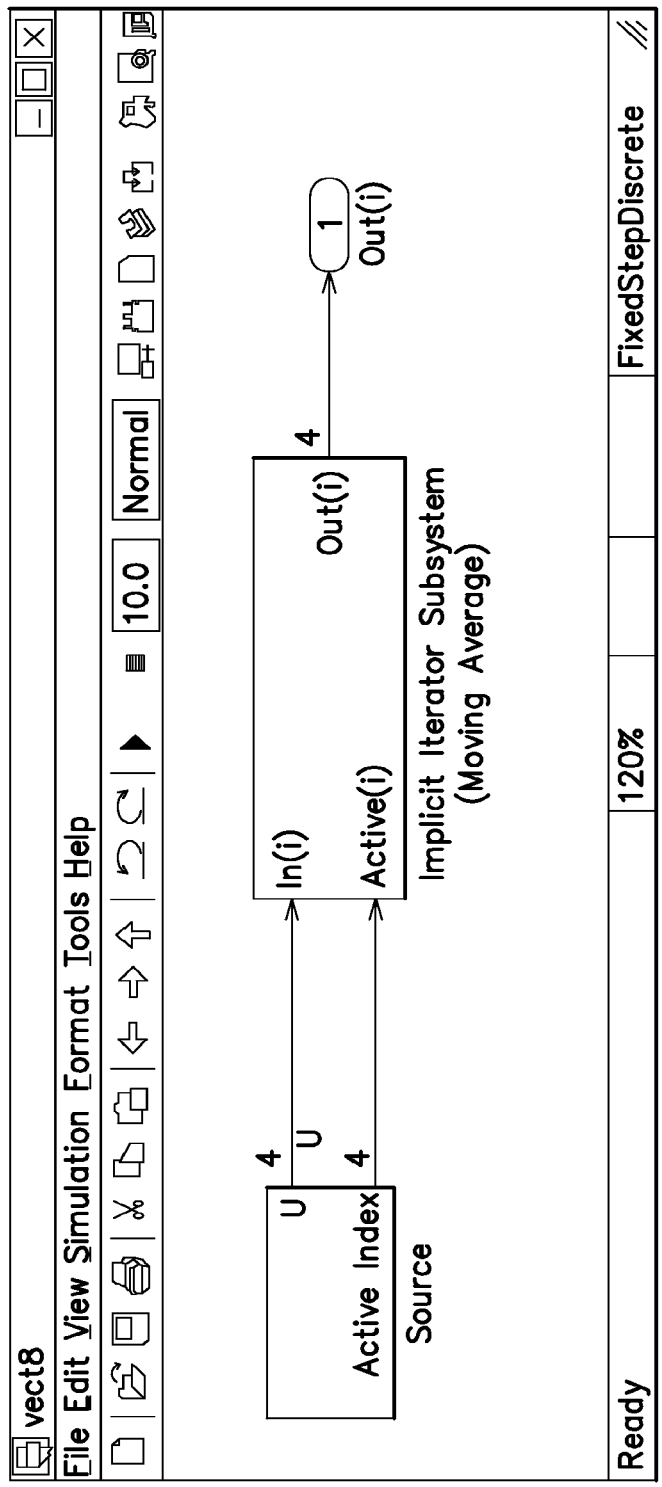
FIGS. 23A-23B illustrate an example implementation that may use variable sized signals according to an embodiment of the invention.
Figure 23B:
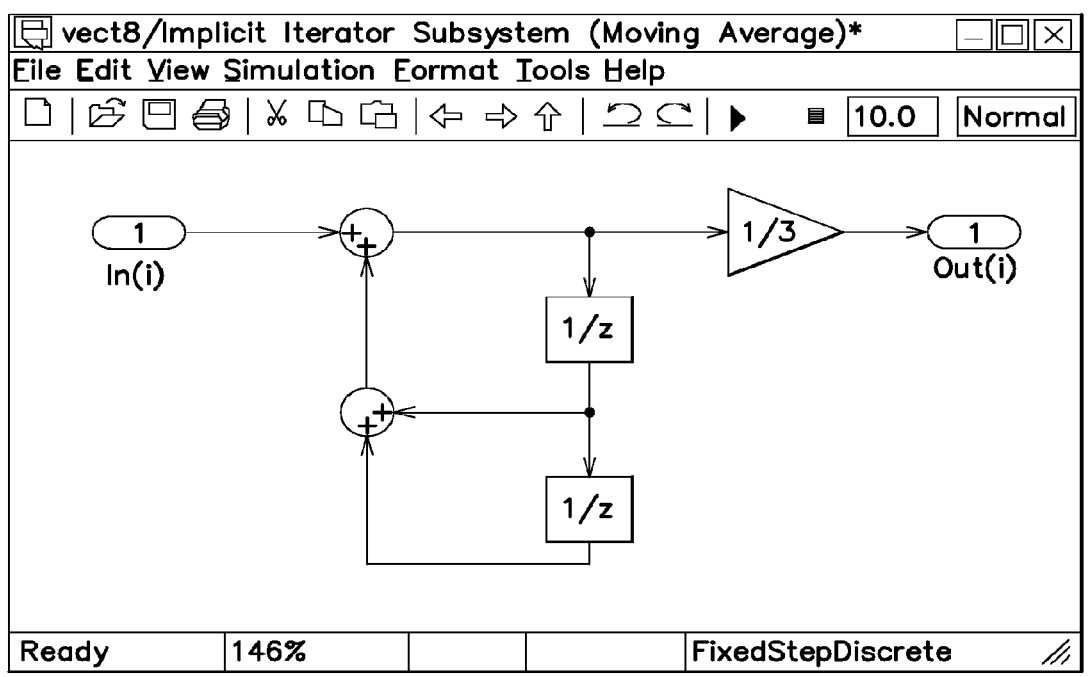

FIG. 23A-B illustrate an example of how the moving average example described above (FIG. 7) may be implemented using the Implicit Iterator system. This example illustrates the conciseness of the implicit iterator system. One 3-point moving average is used for all active signal elements. The states of the Unit Delay (1/z) blocks are unique for each iteration. The number of iterations is based on the signal dimension of the first input port signal (u) and the number of active elements (Active Index). For this example the number of iterations may be between 0 and 4 because the dimensions of the first and second input to the Implicit Iterator subsystem are 4.

A further refinement of the above handling of variable size signals may include resetting sets of states corresponding to inactive iterations after a pre-specified number of execution steps. This may allow iterations to be refreshed and restarted. This capability may be particularly useful in various scenarios, such as the tracking of objects as described above. When an object being tracked disappears for a sufficient period of time, the tracked object may be considered to have disappeared and therefore all states corresponding to the tracked object may be reset. On the other hand, if the object disappears and reappears before a certain amount of time has elapsed, it may be beneficial to resume processing for that object (e.g., tracking trajectory of the object) by using states that were accumulated during previous processing of that particular object. Note that while the system shown in FIG. 23A uses an "active indices" signal including zeros and ones, it should be noted that other signal types (such as unique textual labels) may be used by the system to capture the same or similar information.

Also, it should be noted that this type of handling of variable signals using implicit iterator subsystems can also be extended to multiple inputs that have different iteration indices. Such an additional functionality could be implemented by providing "active indices" information for each unique index used by the implicit iterator subsystem. In an embodiment, one or more of these active indices signals could either be passed into the subsystem via a composite (bus) signal. Alternatively, the active indices signals could be transferred to separate ports on the subsystem and input into the subsystem via the ports.

Some models may include a conditionally executed subsystem. A conditionally executed subsystem may include a subsystem that executes when a precondition of the subsystem is true, e.g., an enable and/or a trigger signal, a function-call signal, an action signal, etc. According to one aspect, functionality of implicit iterator systems, as described above, may be extended to conditionally executed subsystems. Specifically, the properties of implicit iterator systems may be combined with conditionally executed subsystems, such that when a conditionally executed subsystem (or model) executes, the subsystem (or model) iterates following the semantics of implicit iterator systems.

According to another aspect, blocks supporting implicit iteration may be configured to support dynamic propagation of signal dimensions. Specifically, the signal dimensions of the contents of an implicit iterator system may be defined by the contents of the implicit iterator system, and are not necessarily influenced by the external signals. When this is the case, the dimensions of the external signals can be changed (e.g., during model edit) without modifying the contents of the Implicit Iterator System. This capability permits reuse of modeling constructs that support implicit iteration.

Furthermore, dynamic propagation of signal dimensions may be checked for consistency. For example, in the example discussed above with respect to FIG. 15, with Inports "In1" and "In2" blocks with "a", "b" inputs (1505, 1506) may have the constraint that the "b" input signal (1506) is twice the dimension of the "a" input signal (1505). Thus, inherently to the model 1501, there may be a requirement that any dimension propagation ensures that the signal dimensions are consistent at model compilation time (for signal "b" to be twice the dimension of signal "a", in the example).

It may be desired that all elements of the output signals of a block in a system, performing implicit iteration, be written when the system executes. For many simple cases, such as an unconnected input of an Outport block in an Implicit Iterator System, a consistency check may be preformed at model initialization (compile) time. However, run-time checks may be needed to handle the general case.

For example, consider a model that at times may fail to write to an output signal "y". A diagnostic may be run to detect when one fails to write to an output signal. The diagnostic may include a simple algorithm that writes an invalid value to all elements of the output signal before executing the Implicit Iterator System. The value that is written may be, for example, a NaN (Not a Number) indication. If any NaNs remain in any of the elements of the output signal, then it can be determined that the contents of the Implicit Iterator System failed to write the output signal. If there are no invalid values that can be used to detect lack of writes, then an internal Boolean vector or matrix may be updated when each iteration writes to the output. If any elements of the Boolean vector are false, then a run-time error is detected.

Run-time diagnostics can also be used to detect redundantly assigned elements. Rather than using a Boolean vector/matrix to track what has happened, the execution engine can, for example, use an integer vector/matrix that may be initialized to zero and incremented by one. If any element is not a one after the block that performs implicit iteration executes, then there is the case of either no writer or redundant writes.

In debugging mode, annotations may be provided and displayed to the user that communicates the current index value. For example, a debugger program may be enhanced to show the value of an iteration variable on an implicit iterator system block icon. For instance, in a display similar to that shown in FIG. 15, the current value of the iteration may displayed in association with the displayed block 1501.

The process of executing a block diagram (or converting the block diagram to generated code or a hardware description language) may involve, for example, updating engines (e.g., code generation engines, simulation engines, etc.) to understand semantics of implicit iterator systems. Updating the engines may enable a model containing an implicit iterator subsystem to be simulated, code to be generated for the model, or hardware to be synthesized for the model. The realization for generated code can be achieved, for example, by creating functions (methods) that implement the basic system and then are called with values for each index, or the indexing code can be inside the function, and the dimension of the signals are passed in.

Implicit iterator functions can be applied to any type of system with states, including time-domain blocks, state chart-based blocks, data flow domains, etc.

Figure 24A:
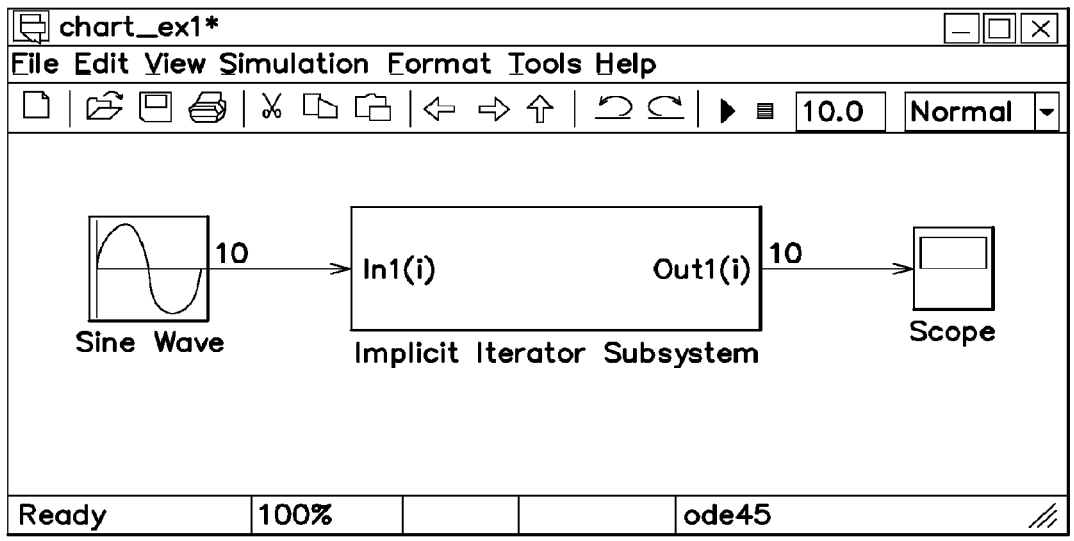
FIGS. 24A-24B and 25 illustrate an example state-based implementation in which implicit iteration may be used in accordance with an embodiment of the invention.
Figure 24B:
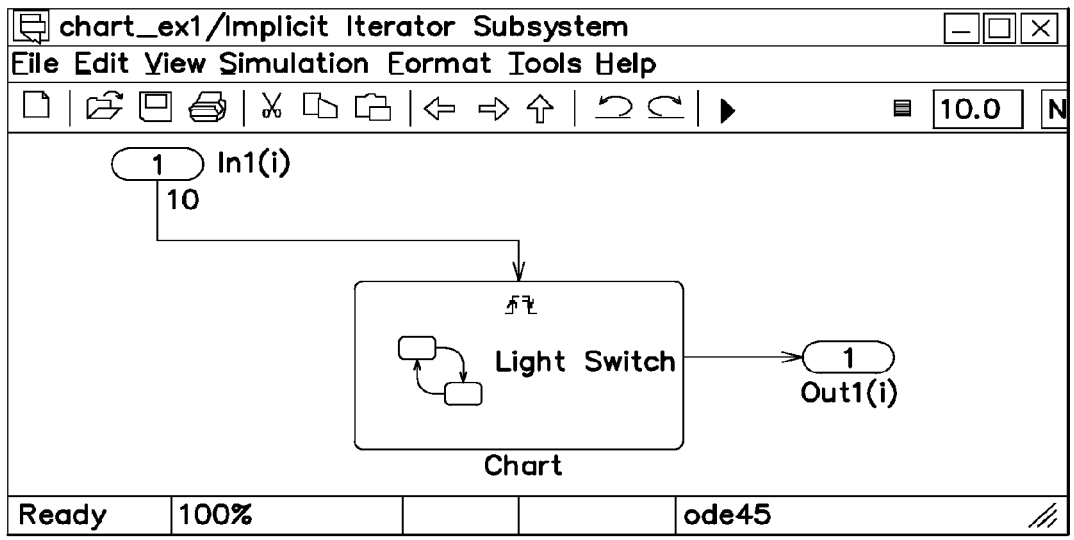
Figure 25:
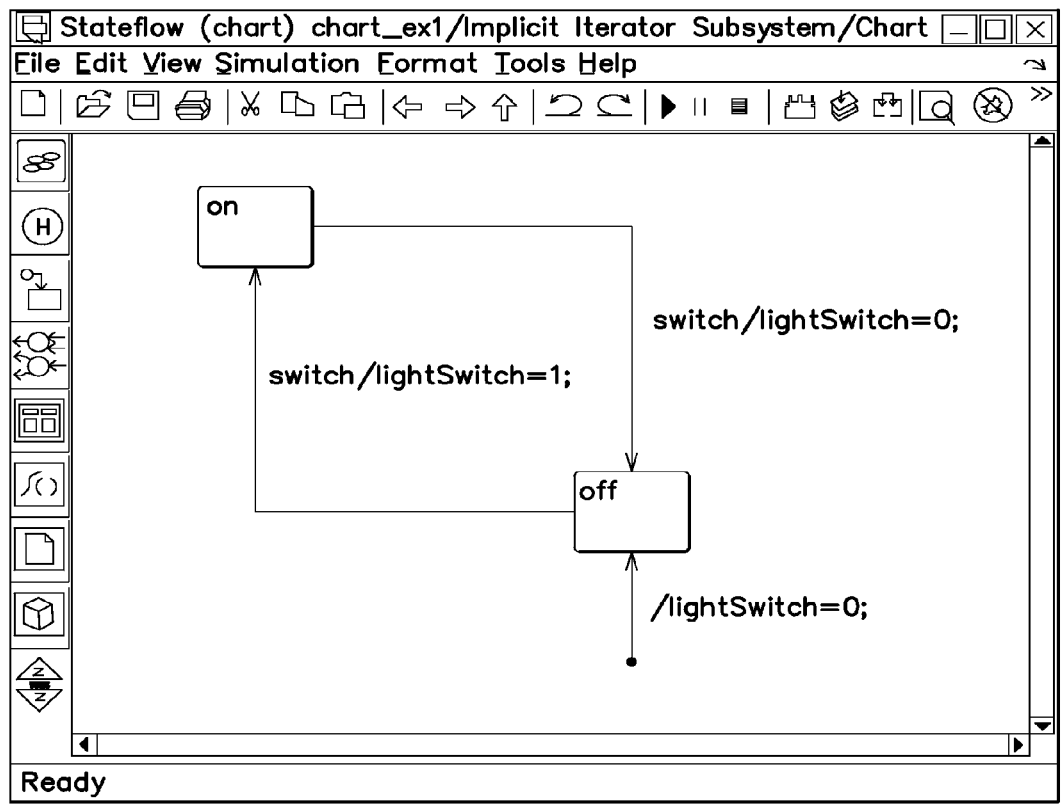

In one example implementation, a state chart can be configured to implicitly index. Consider the model shown in FIGS. 24A-24B, with its corresponding state chart shown in FIG. 25. In the system shown in FIG. 25, for each iteration of the indexed subsystem, the chart is supplied with a new state bank (for example, to track whether the chart is in the on or off state).

Figure 26:
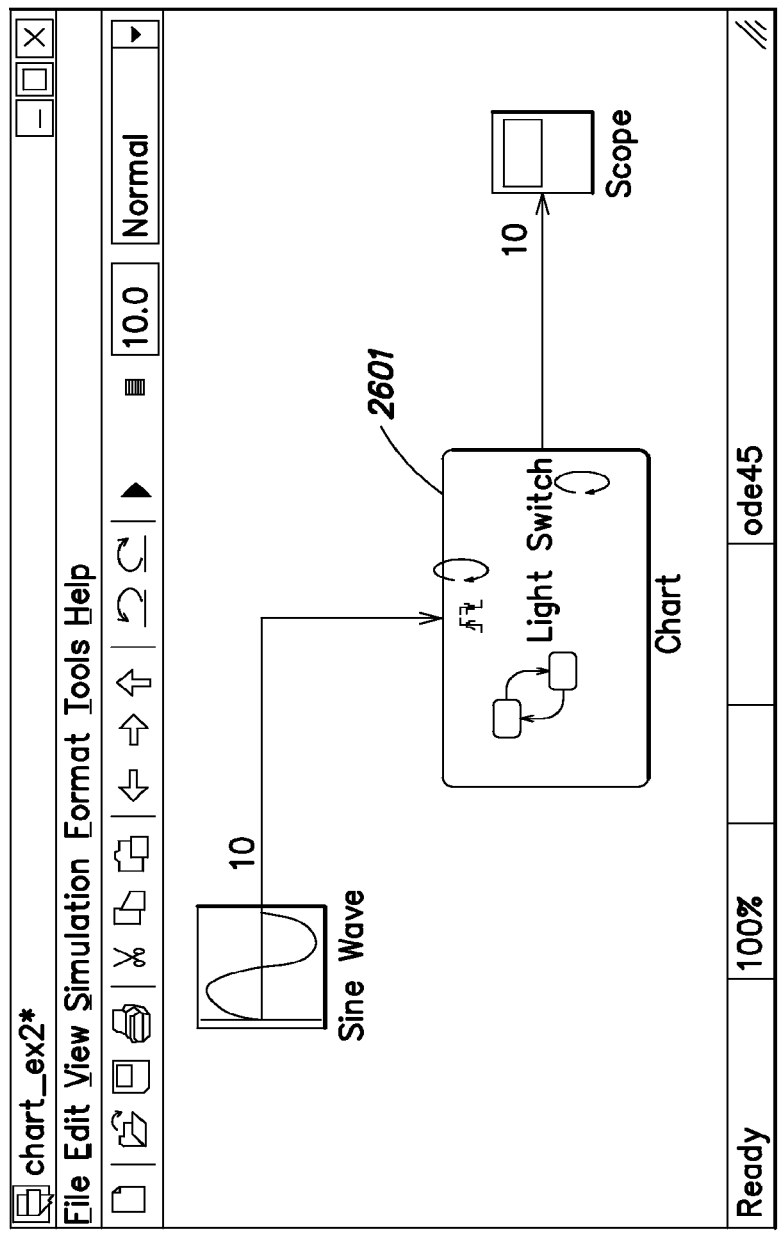
FIG. 26 illustrate an example interface that may indicate that a particular chart may perform implicit iteration according to an embodiment of the invention.

Alternatively, one can explicitly specify that the block be directly indexed as shown in FIG. 26. Chart 2601 shown in FIG. 26 can be described as an Implicit Iterator system. Chart 2601 can also be referred to as a "scalarizable" chart or atomically scalarizable chart because the indexing is performed by one. However, if the indexing is not performed by one, then the term scalarizable chart may not be appropriate.

In state charts and other graphical modeling domains, there may be a need to perform decisions on the values of the overall state vector for an implicit iterator system. This can be achieved, for example, by adding blocks or operators (including textual statements similar to MATLAB® all and any operators) that execute after all iterations have been performed.

With state charts, a common engineering problem may include applying a control algorithm or logic to multiple entities. Basically, the same function may be used on many entities using instance specific data (states). Examples of those problems may include, for example, computing an angular speed of a wheel of a car or an amount of gasoline fuel injected into a cylinder of an engine.

One approach that may be used to address the above problem may be to use vectors for instance specific states and signals (data), where each element represents one entity upon which the algorithm is applied. This approach may be very flexible because the algorithm may not need to be changed if the number of entities changes. One problem with this approach, however, is that the states in statecharts may be scalar values and may only apply to one instance. Another approach may include manually instantiating a function and creating as many instances as there are entities. This approach may require a change of the model every time the number of entities changes.

Figure 27:
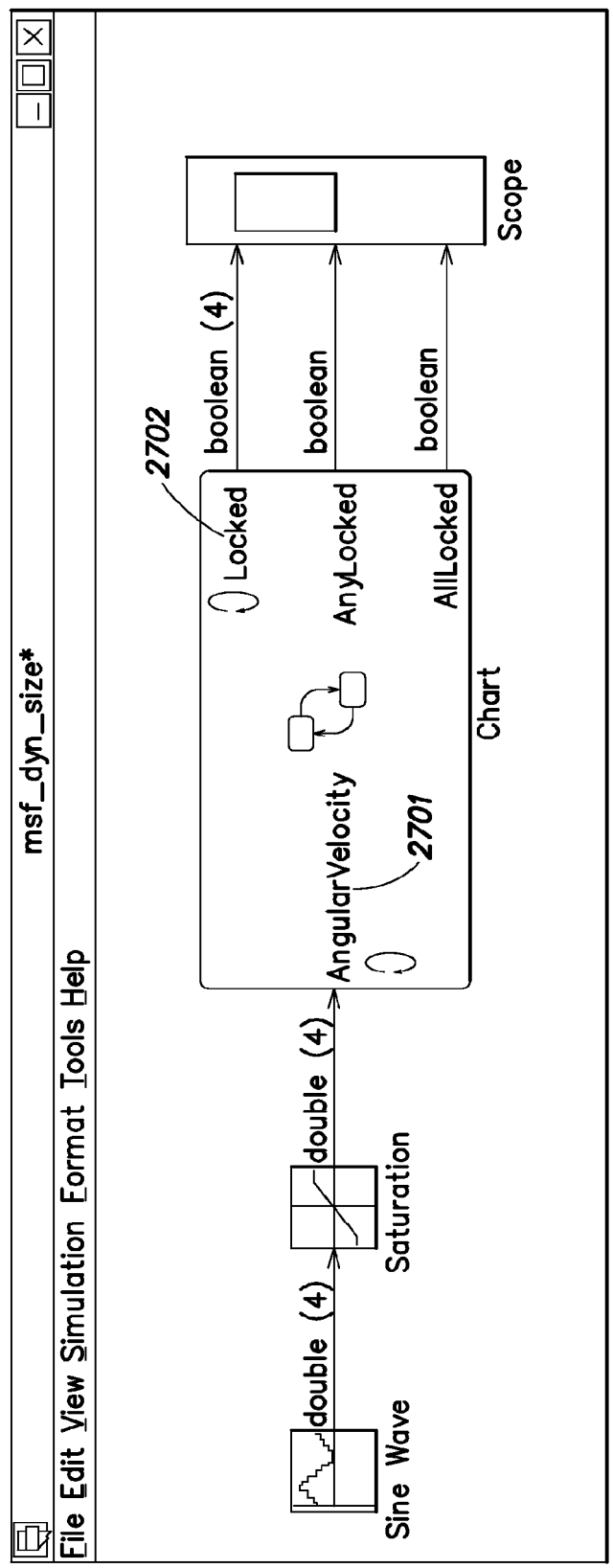
FIG. 27 illustrates another example chart that may use implicit iteration which may be dependent on the size of one or more input signals.

As discussed above, applying the implicit iterator aspects to charts may help solve this problem, but there may be additional issues with completely solving a class of problems where there may be a need to make decisions of the outcome of each iteration within the chart. Creating an implicit iterator chart (i.e., a chart that performs implicit iteration), wherein given inputs can be specified that they are indexed along with providing ANY and ALL operators as discussed below may help reduce modeling complexity and increase efficiency. The number of iterations may be dependent on the size of the input signals. For instance, in the example shown in FIG. 27, the AngularVelocity signal 2701 may be indexed by one and the Locked signal 2702 may be indexed by one.

According to one embodiment, implicit iteration may be extended to apply within states of a chart. Here, a child state of an indexed (e.g. scalarizable) state may also be indexed (scalarizable) and inherit its size. According to another embodiment, an indexed (scalarizable) state may not have a scalar child state or directly communicate with a scalar state. Any element wise (index) operations may be prohibited and special operators may be used in order the use the state information of an indexed (scalarizable) chart. For example, as discussed further below, the operators ANY and ALL may be used with a scalarizable chart. These operators may, according to one embodiment, make decisions based on an outcome of one or more iterations in a state chart.

Figure 28:
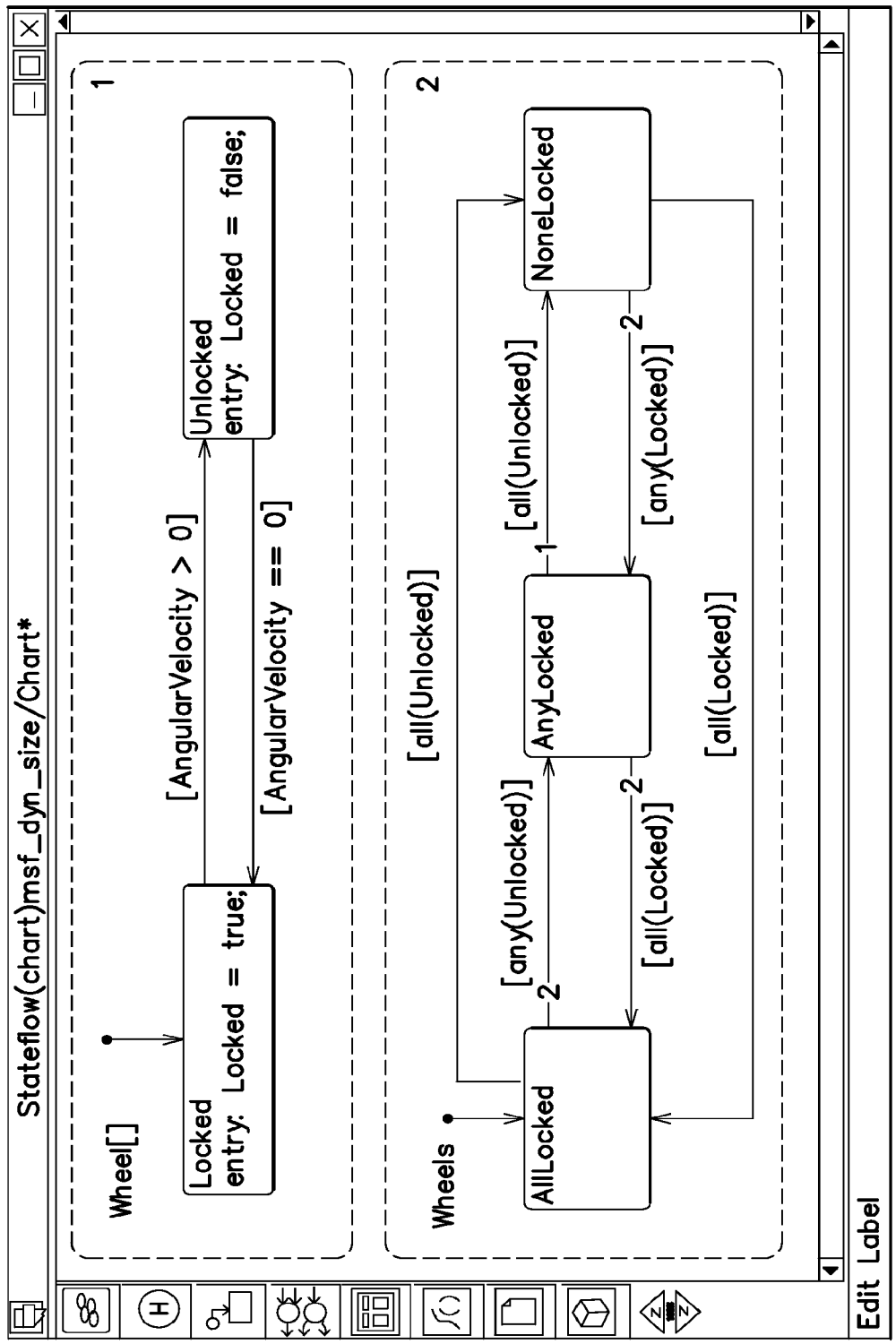
FIGS. 28-29 illustrates example animation mode/debug interfaces in accordance with an embodiment of the invention.

FIG. 28 shows an example of an implicit iteration applied to a state chart. The example contains two states, the top state being marked as an implicit iterator (scalarizable) state as indicated by the "Wheel[ ]" label and a property indicating that this state is iterated four (4) times, one for each wheel. This state may encapsulate various logic associated with a wheel, e.g., detecting when wheel may be locked (skidding) or not. The lower state, "Wheels", may represent an overall state of all the wheels. For example, the transition from "AllLocked" to "NoneLocked" may occur when all of the "Wheel[i]" states are unlocked, i.e., all perform an operation of using each of the state variables of the implicit iterator system, the Wheel[ ] chart in this case. The result of the "all( )" operator may be to return a Boolean TRUE state if all of the "Wheel[i]" states are in an Unlocked state.

Figure 29:
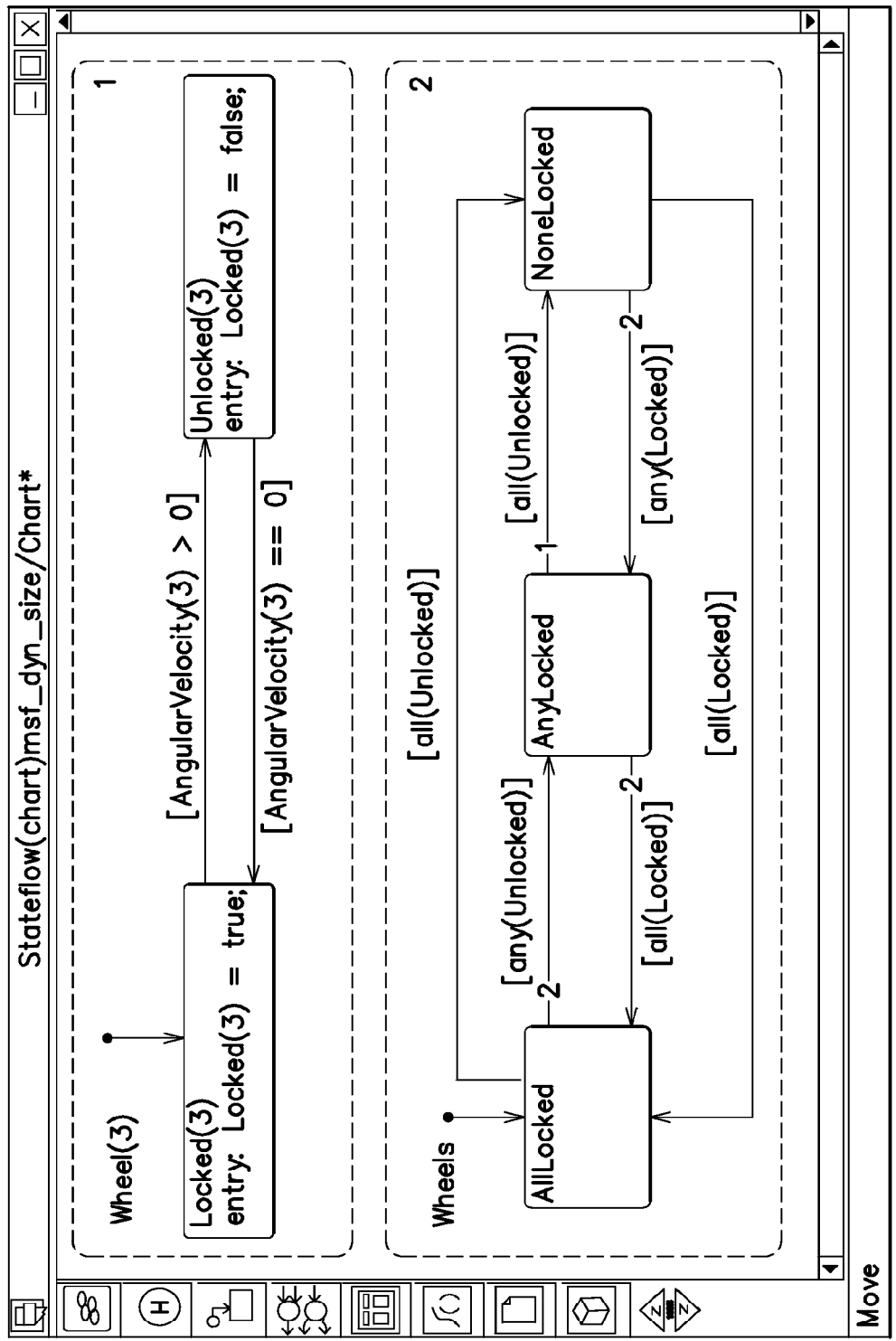

As shown in FIGS. 28 and 29, in debug or animation mode, a current instance number may be displayed on a non-scalar entity in a chart, if an automatically scalarized state chart is executed. The displayed state information may reflect a state of the actual active instance.

As discussed above, it should be appreciated that aspects may be applied to other block-diagram modeling paradigms such as state transition diagrams, discrete event modeling, and dataflow modeling.

Figure 30:
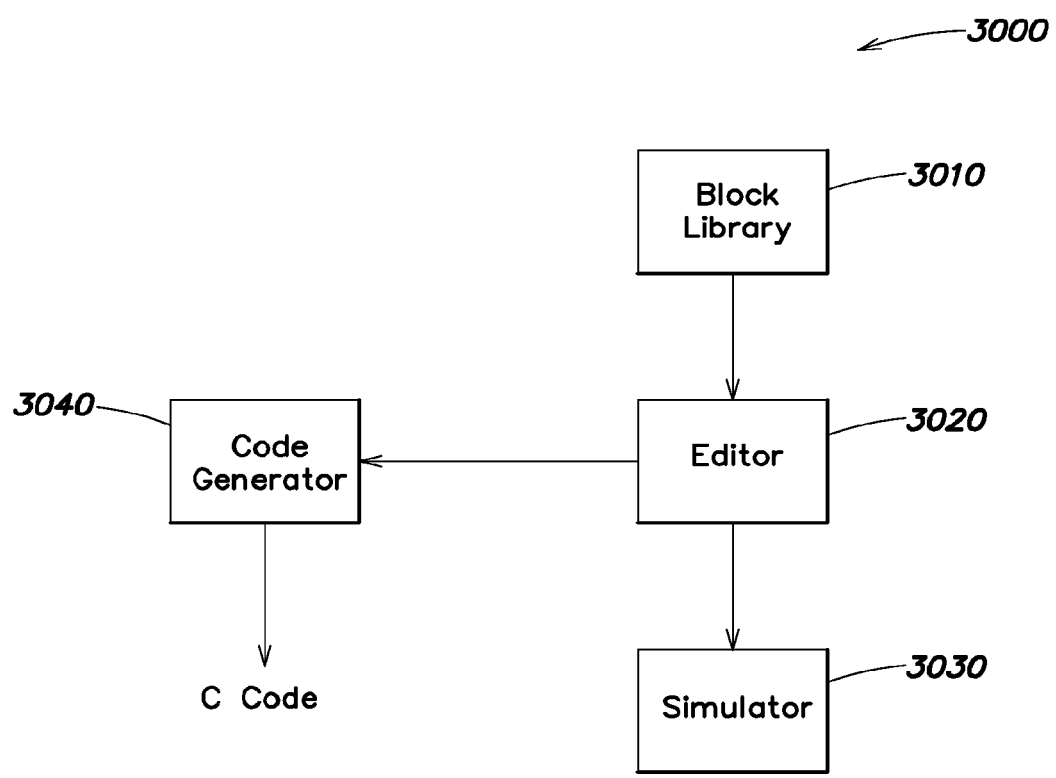
FIG. 30 illustrates an example graphical programming environment that may be used to practice an embodiment of the invention.

According to one embodiment, various aspects may be implemented in a graphical programming environment that uses blocks to represent models. FIG. 30 shows an example block diagram of a graphical programming environment that may utilize blocks to represent models. Environment 3000 includes a block library block 3010, an editor 3020, a simulator 3030 and a code generator 3040. Further, a code generator 3040 may be provided that is capable of generating source code for the models.

Block library 3010 may contain blocks that may be used in models that represent various systems. Blocks in the block library 3010 may be incorporated into the models using modeling and simulation tool 3030. Blocks provided from the block library 3000 may generally be represented by rectangular blocks according to one embodiment. However, models can be represented using other graphical symbols or textual symbols.

Blocks provided by the block library 3010 may include a block processing block for processing data that is input into a model. Block library 3010 may also include component blocks of the block processing block that may be combined to implement a block processing function. Block processing according to one embodiment may be implemented in multiple blocks that may include the components of the block processing block. According to one embodiment, block library 3010 may include blocksets, such as DSP blocksets, Fixed-point Blocksets and Communications Blocksets, which are available from The MathWorks, Inc. The Simulink® blocksets may provide models and utilities for the development and integration of models for target systems and sub-systems of the target systems.

Editor 3020 and simulator 3030 may provide a graphical simulation and prototyping environment that may be used to model, simulate, and analyze a system. Editor 3020 may incorporate blocks provided from block library 3010 into a model of the system. The model may be simulated by simulator 3030 to analyze the behavior of the system.

A block diagram programming environment may allow users to customize a model by (a) reorganizing blocks in some custom format in the model, (b) delete blocks from the model, and (c) add custom blocks to the model, etc. The blocks may be dragged and dropped from the block library 3010 onto a canvas.

The block diagram programming environment may include a block diagram editor that may allow a user to generate block diagrams representations of systems. The editor may include various functions that allow a user to draw, edit, annotate, save, and print out the block diagram representations. The block diagrams may be used to represent models of the systems.

The block diagram editor may interface with the user using graphical user interface (GUI) or a text-based interface. The text-based interface may include a set of commands that allow interaction with the graphical editor. Using the text-based interface, users may write special scripts that perform automatic editing operations on the block diagram.

The block diagram programming environment may also allow users to simulate the designed models to determine the behavior of the systems they represent. Further, the environment may include a block diagram execution engine that is configured to compile and link the block diagram to produce an "in-memory executable" version of the model that may be used for generating code and/or simulating a block diagram model.

The code generator 3040 may generate source code (e.g., C-code, C++, Ada) from a block diagram that is designed using the editor 3020. Code generator 3040 may be used to generate source code for embedded systems applications. The source code may be an illustrative code that is generated in the code generator 3040 and the code generator 3040 may generate different code for the models, such as Ada. Real-Time Workshop from The MathWorks, Inc., is one example of a code generation tool that may be used as code generator 3040. Although source code such as code written in Ada can be generated by a code generator 3040, other types of code, such as object code, pseudo-code, among others, may be generated instead of or in addition to source code.

The graphical programming environment 3000 is not limited to block diagram programming environments, but rather may include any other graphical programming environments, such as state flowchart graphical programming environments. For instance, the graphical programming environment may provide for state flowchart modeling and the design of event-driven models. The graphical programming environment may enable users to generate state flowcharts that graphically represent hierarchical and parallel states and the event-driven transitions between the states of the models. The graphical programming environment may execute the models and analyze the behavior of the models based on the state flowcharts.

Figure 31:
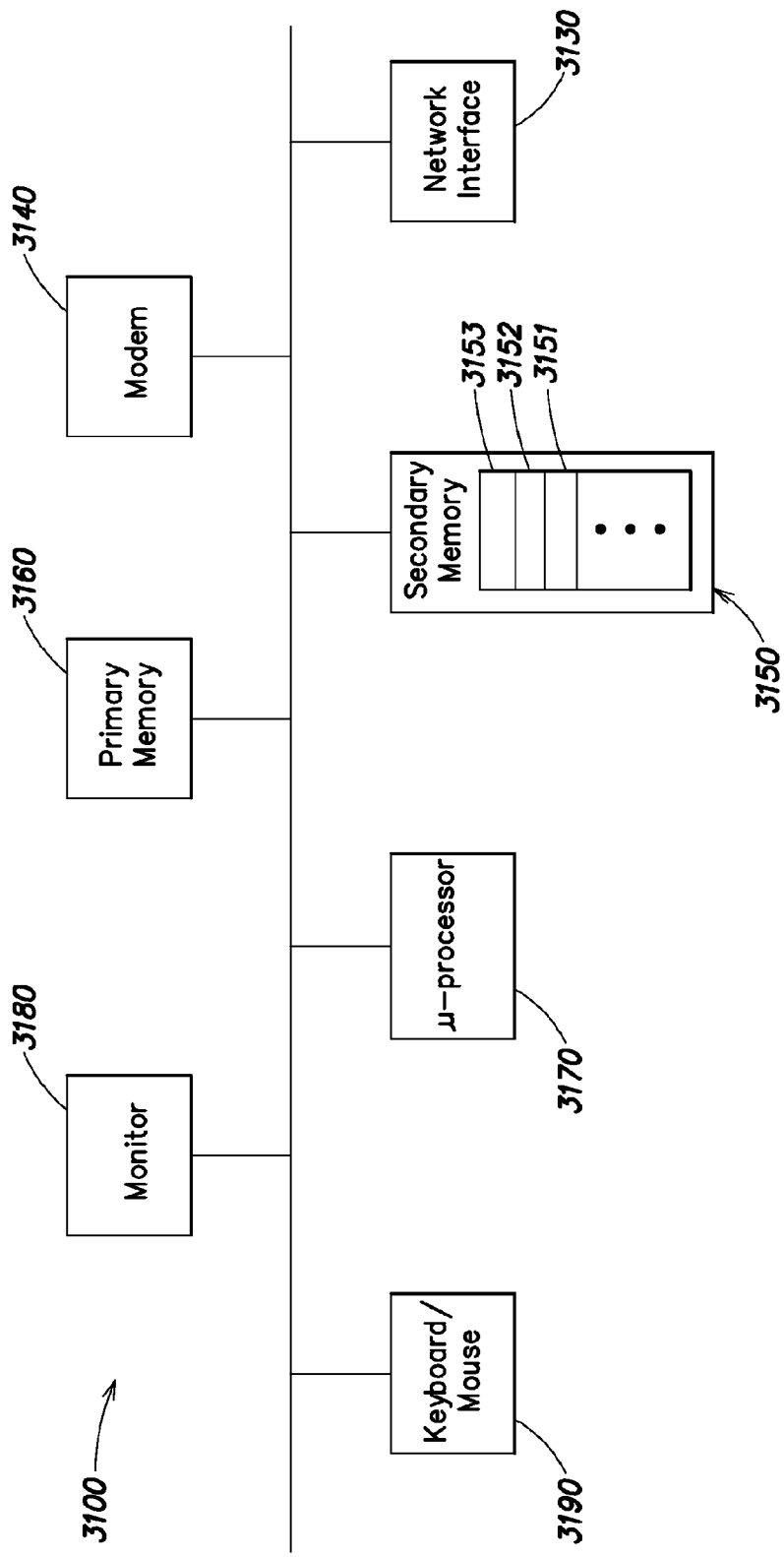
FIG. 31 illustrates an example of a general-purpose computer system that may be configured to practice an embodiment of the invention.

FIG. 31 shows an example of an electronic device 3100 that may be used to implement various embodiments of the invention. Device 3100 may be, for example, a general purpose computing device, such as a personal computer (PC).

Electronic device 3100 may include a network interface 3130, a secondary memory 3150, a primary memory 3160, a processor 3170, an output device 3180 and an input device 3190. Processor 3170 may control each component of the electronic device 3100 to run the software tools in the graphical programming environment 3000. Electronic device 3100 may receive data, necessary for controlling the design and simulation of a system, via the keyboard/mouse 3190. The data may include control data that may be used to set up operation modes of a block processing block.

Electronic device 3100 may display in monitor 3180 the result generated in the graphical programming environment 3100.

The primary memory 3160 may comprise logic configured to implement a primary storage for the system 3100. The primary memory 3160 may be directly accessible to the processor 3170. The primary memory 3160 may be organized as a random-access memory (RAM) and may be implemented using some combination of volatile and non-volatile RAM devices. These devices may include Dynamic RAM (DRAM) devices, flash memory devices, Static RAM (SRAM) devices, etc.

Primary memory 3160 may fetch information contained in secondary memory 3150 and provide the information to the processor 3170. Secondary memory 3150 may comprise logic configured to implement a secondary storage for system 3100. Secondary memory 3150 may contain various information used by the processor including code 3151 for the block library 3010, code 3152 for editor 3020, and code 3153 for simulator 3030.

The network interface 3130 may comprise logic configured to interface the system 3100 with a network (not shown) and enable the computer system 3100 to exchange information with other entities connected to the network. The network interface 3130 may be implemented as a built-in network adapter, network interface card (NIC), Personal Computer Memory Card International Association (PCMCIA) network card, card bus network adapter, wireless network adapter, Universal Serial Bus (USB) network adapter, modem or other device suitable for interfacing system 3100 to a network.

Although the examples above have been described relative to a block diagram model, it should be appreciated that aspects may be practiced relative to models implemented in other graphical modeling environments, including but not limited to LabVIEW from National Instruments Corporation of Austin, Tex., and Rational Rose from International Business Machines of White Plains, N.Y., etc.

The foregoing description of example embodiments provides illustration and description, but is not intended to be exhaustive or to limit the invention to the precise form disclosed. Modifications and variations are possible in light of the above teachings or may be acquired from practice of the invention.

Also, the term "user", as used herein, is intended to be broadly interpreted to include, for example, a computer system (e.g., a workstation) or a user of a computer system, unless otherwise stated.

It will be apparent that embodiments, described herein, may be implemented in many different forms of software and/or hardware in the implementations illustrated in the figures. Software code and/or specialized hardware used to implement embodiments described herein is not limiting of the invention. Thus, the operation and behavior of the embodiments were described without reference to the specific software code and/or specialized hardware—it being understood that one would be able to design software and/or hardware to implement the embodiments based on the description herein.

Portions of the invention may be implemented as "logic" that performs one or more functions. This logic may include hardware, such as an application specific integrated circuit or a field programmable gate array, software, or a combination of hardware and software. The logic may be encoded in one or more executable media and may include instructions for execution by a processor, such as processor 3170.

It should be noted that one or more computer-readable media may store computer-executable instructions that when executed by a processor, such as processor 3170, may perform various acts associated with one or more embodiments of the invention. The computer-readable media may be volatile or non-volatile and may include, for example, flash memories, removable disks, non-removable disks, and so on.

It should be further noted that various electromagnetic signals, such as wireless signals, electrical signals carried over a wire, optical signals carried over optical fiber, etc., may be encoded to carry computer-executable instructions, configured to implement one or more embodiments of the invention, on a network, such as, for example, the Internet.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
    determining, by a first computing device, a quantity of iterations to perform by one or more elements of a model based on at least one object and at least one signal of the model, the model including the at least one object,
        the model representing one or more dynamic systems,
        the quantity of iterations being determined based on a signal size of the at least one signal; and
    generating, by the first computing device, code for the model,
        the code comprising instructions such that, when the code is executed, the instructions cause a second computing device to:
            execute the one or more elements of the model by performing the quantity of iterations, using code corresponding to the at least one object and the at least one signal, to determine a behavior of the one or more dynamic systems.

2. The method of claim 1, where the model corresponds to a block diagram model,
    where the at least one object corresponds to at least one block of the block diagram model, and
    where the at least one signal corresponds to at least one signal of the at least one block.

3. The method of claim 2, where the quantity of iterations corresponds to a quantity of iterations, to be performed by the at least one block, over the at least one signal of the at least one block.

4. The method of claim 1, where generating the code for the model includes:
    generating source code for the model.

5. The method of claim 2, where the at least one signal of the at least one block includes at least one of an input signal or an output signal.

6. The method of claim 4, where the source code includes C++ code.

7. The method of claim 6, where the source code includes C-code.

8. A non-transitory computer-readable medium storing instructions, the instructions comprising:
a plurality of instructions which, when executed by a first computing device, cause the first computing device to:
determine a quantity of iterations to be performed by one or more elements of a model based on at least one object and at least one signal of the model representing one or more dynamic systems,
the model including the at least one object,
the quantity of iterations being determined based on a size of the at least one signal, and
generate code for the model,
the code comprising instructions such that, when the code is executed, the instructions cause a second computing device to:
execute the one or more elements of the model by performing the quantity of iterations, using code corresponding to the at least one object and the at least one signal, to determine a behavior of the one or more dynamic systems.

9. The non-transitory computer-readable medium of claim 8, where one or more instructions, of the plurality of instructions, to generate the code for the model include:
one or more instructions to generate source code for the model.

10. The non-transitory computer-readable medium of claim 9, where the source code includes C++ code.

11. The non-transitory computer-readable medium of claim 9, where the source code includes C-code.

12. The non-transitory computer-readable medium of claim 8, where the instructions further comprise:
one or more instructions to automatically update the quantity of iterations to obtain an updated quantity of iterations; and
one or more instructions to cause the updated quantity of iterations to be performed to obtain one or more results.

13. The non-transitory computer-readable medium of claim 12, where the one or more instructions to automatically update the quantity of iterations include:
one or more instructions to detect that the size of the at least one signal has been adjusted to an adjusted size; and
one or more instructions to automatically update the quantity of iterations based on detecting that the size of the at least one signal has been adjusted to the adjusted size.

14. The non-transitory computer-readable medium of claim 8, where the model corresponds to a block diagram model,
where the at least one object corresponds to at least one block of the block diagram model,
where the at least one block represents a physical component of the one or more dynamic systems,
where the at least one signal corresponds to at least one of an input signal of the at least one block or an output signal of the at least one block, and
where the quantity of iterations corresponds to a quantity of iterations, to be performed by the at least one block, over the at least one the input signal or the output signal.

15. The non-transitory computer-readable medium of claim 8, where the instructions further comprise:
one or more instructions to store one or more states of the at least one object for each iteration of the quantity of iterations.

16. A device comprising:
a memory to store instructions; and
a processor to execute one or more of the instructions to:
determine a quantity of iterations to be performed by one or more elements of a model based on at least one object and at least one signal of the model,
the model representing one or more dynamic systems,
the model including the at least one object,
the quantity of iterations being determined based on a size of the at least one signal,
generate code for the model,
the code comprising instructions such that, when the code is executed, the instructions cause another device to:
execute the one or more elements of the model by performing a quantity of iterations, using code corresponding to the at least one object and the at least one signal, to determine a behavior of the one or more dynamic systems.

17. The device of claim 16, where the processor is further to:
store one or more states of the at least one object for each iteration of the quantity of iterations.

18. The device of claim 16, where the code includes:
C++ code, or
C-code.

19. The device of claim 16, where the at least one signal includes at least one of an input signal or an output signal of the at least one object.

20. The device of claim 16, where the at least one object corresponds to at least one block of a block diagram model, and
where the quantity of iterations corresponds to a quantity of iterations, to be performed by the at least one block, over the at least one signal.

* * * * *